(12) United States Patent  
Yamazaki et al.

(10) Patent No.: US 11,532,650 B2  
(45) Date of Patent: Dec. 20, 2022

(54) DISPLAY DEVICE, METHOD FOR MANUFACTURING THE SAME, AND ELECTRONIC DEVICE

(71) Applicant: Semiconductor Energy Laboratory Co., Ltd., Atsugi (JP)

(72) Inventors: Shunpei Yamazaki, Setagaya (JP); Kenichi Okazaki, Tochigi (JP); Daisuke Kurosaki, Utsunomiya (JP); Yasutaka Nakazawa, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 38 days.

(21) Appl. No.: 17/030,560

(22) Filed: Sep. 24, 2020

(65) Prior Publication Data

US 2021/0020666 A1    Jan. 21, 2021

Related U.S. Application Data

(62) Division of application No. 15/815,985, filed on Nov. 17, 2017, now Pat. No. 10,790,318.

(30) Foreign Application Priority Data

Nov. 22, 2016   (JP) .............................. JP2016-226897

(51) Int. Cl.
   *H01L 21/00*     (2006.01)
   *H01L 27/00*     (2006.01)
   (Continued)

(52) U.S. Cl.
   CPC ........ *H01L 27/1255* (2013.01); *G02F 1/1368* (2013.01); *G02F 1/136209* (2013.01);
   (Continued)

(58) Field of Classification Search
   CPC ............ G02F 1/1368; G02F 1/136286; G02F 1/136213; G02F 1/136209;
   (Continued)

(56) References Cited

U.S. PATENT DOCUMENTS 6,072,450 A    6/2000 Yamada et al.
6,127,199 A   10/2000 Inoue et al.
(Continued)

FOREIGN PATENT DOCUMENTS

EP    0845812 A    6/1998
EP    2511896 A   10/2012
(Continued)

*Primary Examiner* — Nikolay K Yushin
(74) *Attorney, Agent, or Firm* — Robinson Intellectual Property Law Office; Eric J. Robinson

(57) ABSTRACT

A liquid crystal display device with a high aperture ratio is provided. A liquid crystal display device with low power consumption is provided. A display device includes a transistor and a capacitor. The transistor includes a first insulating layer, a first semiconductor layer in contact with the first insulating layer, a second insulating layer in contact with the first semiconductor layer, and a first conductive layer electrically connected to the first semiconductor layer via an opening portion provided in the second insulating layer. The capacitor includes a second conductive layer in contact with the first insulating layer, the second insulating layer in contact with the second conductive layer, and the first conductive layer in contact with the second insulating layer. The second conductive layer includes a composition similar to that of the first semiconductor layer. The first conductive layer and the second conductive layer are configured to transmit visible light.

17 Claims, 18 Drawing Sheets

(51) Int. Cl.
*H01L 29/00* (2006.01)
*G02F 1/1362* (2006.01)
*H01L 27/12* (2006.01)
*H01L 21/02* (2006.01)
*G02F 1/1368* (2006.01)
*H01L 29/786* (2006.01)

(52) U.S. Cl.
CPC .. *G02F 1/136213* (2013.01); *G02F 1/136286* (2013.01); *H01L 21/0214* (2013.01); *H01L 21/02211* (2013.01); *H01L 21/02271* (2013.01); *H01L 21/02274* (2013.01); *H01L 27/127* (2013.01); *H01L 27/1225* (2013.01); *H01L 27/1262* (2013.01); *H01L 27/1266* (2013.01); *H01L 29/7869* (2013.01); *G02F 1/136227* (2013.01); *G02F 2201/44* (2013.01); *G02F 2202/16* (2013.01); *G02F 2203/01* (2013.01)

(58) Field of Classification Search
CPC ........... G02F 1/136227; G02F 2203/01; G02F 2202/16; G02F 2201/44; H01L 21/0214; H01L 21/02271; H01L 21/02211; H01L 21/02274; H01L 27/1225; H01L 27/1255; H01L 27/1266; H01L 27/127; H01L 27/1262; H01L 29/7869; H01L 29/66969; H01L 29/78606
See application file for complete search history.

(56) References Cited

U.S. PATENT DOCUMENTS

| | | | |
|---|---|---|---|
| 7,679,585 B2 | 3/2010 | Kimura | |
| 8,476,625 B2 | 7/2013 | Kimura | |
| 8,643,801 B2 | 2/2014 | Oshima | |
| 8,685,803 B2 | 4/2014 | Chikama et al. | |
| 8,937,307 B2 | 1/2015 | Yamazaki | |
| 8,981,443 B2 | 3/2015 | Kimura | |
| 8,999,750 B2 | 4/2015 | Kimura | |
| 9,147,722 B2 | 9/2015 | Kanegae et al. | |
| 9,201,280 B2 | 12/2015 | Kimura | |
| 9,269,728 B2 | 2/2016 | Yamazaki | |
| 9,449,996 B2 | 9/2016 | Yamazaki et al. | |
| 9,583,516 B2 | 2/2017 | Yamazaki et al. | |
| 9,640,558 B2 | 5/2017 | Kimura | |
| 9,941,309 B2 | 4/2018 | Yamazaki et al. | |
| 10,199,394 B2 | 2/2019 | Yamazaki et al. | |
| 10,224,347 B2 | 3/2019 | Kimura | |
| 10,269,888 B2 | 4/2019 | Yamazaki et al. | |
| RE48,032 E | 6/2020 | Kanegae et al. | |
| 10,706,790 B2 | 7/2020 | Niikura et al. | |
| 10,903,244 B2 | 1/2021 | Kimura | |
| 2006/0145162 A1 | 7/2006 | Yang | |
| 2007/0072439 A1 | 3/2007 | Akimoto et al. | |
| 2009/0141203 A1 | 6/2009 | Son et al. | |
| 2009/0283762 A1 | 11/2009 | Kimura | |
| 2011/0210325 A1 | 9/2011 | Sakakura et al. | |
| 2014/0070209 A1 | 3/2014 | Yamazaki et al. | |
| 2014/0357019 A1 | 12/2014 | Koyama et al. | |
| 2015/0108474 A1 | 4/2015 | Yamazaki et al. | |
| 2015/0214249 A1 | 7/2015 | Cheng et al. | |
| 2017/0168333 A1 | 6/2017 | Kubota et al. | |
| 2017/0287943 A1* | 10/2017 | Ma | G09G 3/2092 |
| 2021/0249444 A1 | 8/2021 | Kimura | |

FOREIGN PATENT DOCUMENTS

| | | |
|---|---|---|
| JP | 10-161564 A | 6/1998 |
| JP | 2006-072373 A | 3/2006 |
| JP | 2007-041571 A | 2/2007 |
| JP | 2007-096055 A | 4/2007 |
| JP | 2007-123861 A | 5/2007 |
| JP | 2009-302520 A | 12/2009 |
| JP | 2010-156963 A | 7/2010 |
| JP | 2011-077513 A | 4/2011 |
| JP | 2012-182165 A | 9/2012 |
| JP | 2014-063141 A | 4/2014 |
| JP | 2014-199402 A | 10/2014 |
| JP | 2015-179247 A | 10/2015 |
| JP | 2015-179248 A | 10/2015 |
| KR | 2014-0052450 A | 5/2014 |
| WO | WO-2011/070981 | 6/2011 |
| WO | WO-2012/118006 | 9/2012 |
| WO | WO-2014/021356 | 2/2014 |
| WO | WO-2014/147964 | 9/2014 |
| WO | WO-2016/087999 | 6/2016 |

* cited by examiner

FIG. 3A1
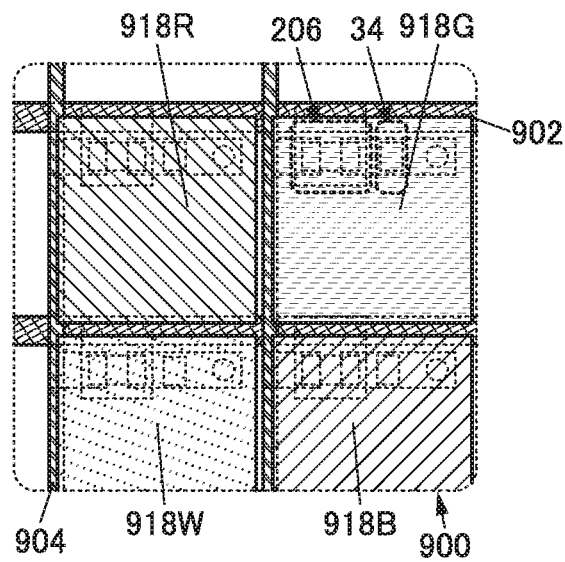
FIG. 3A2
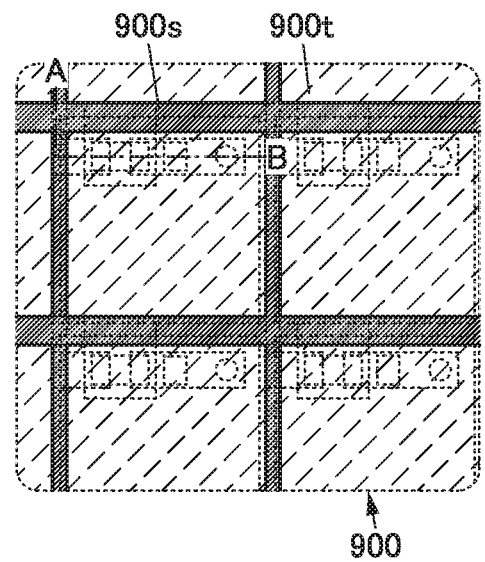
FIG. 3B
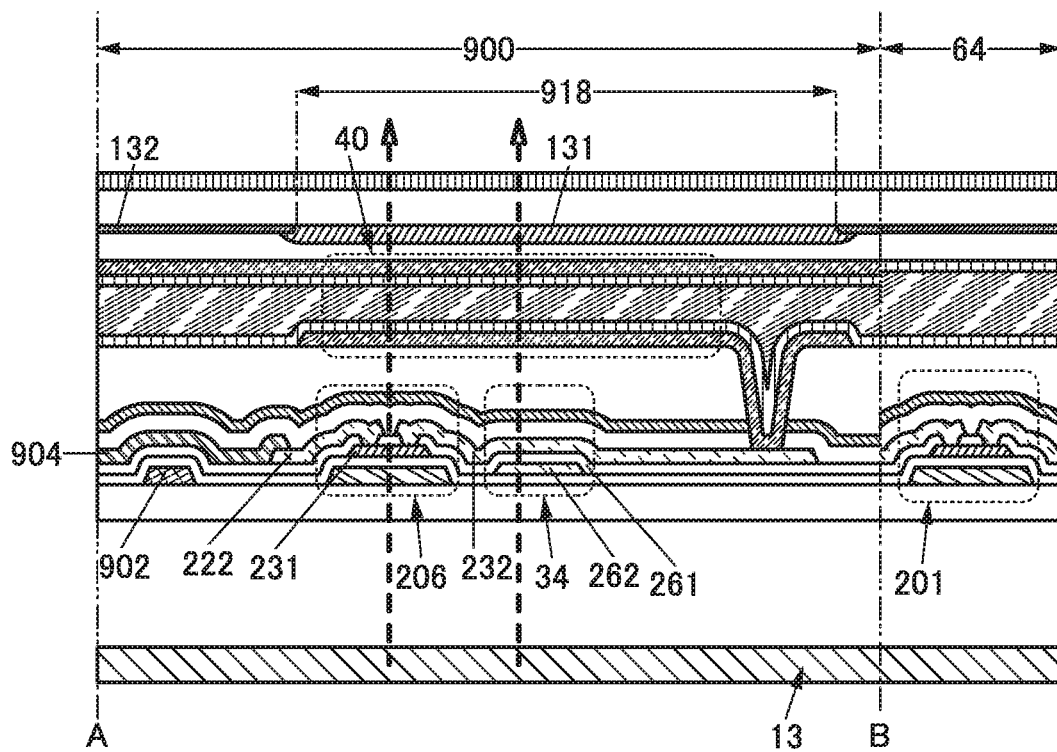

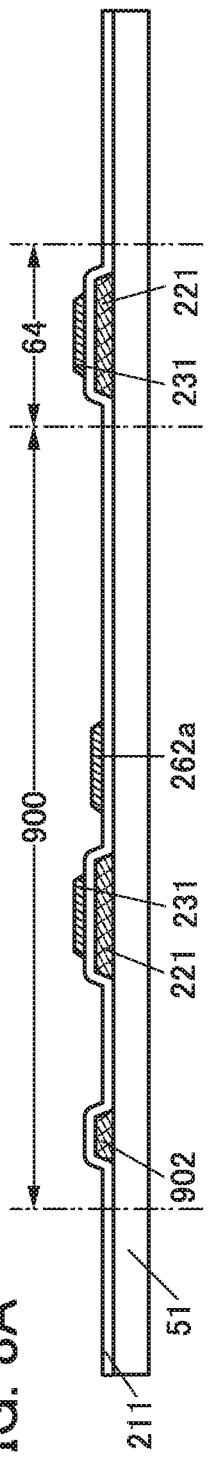
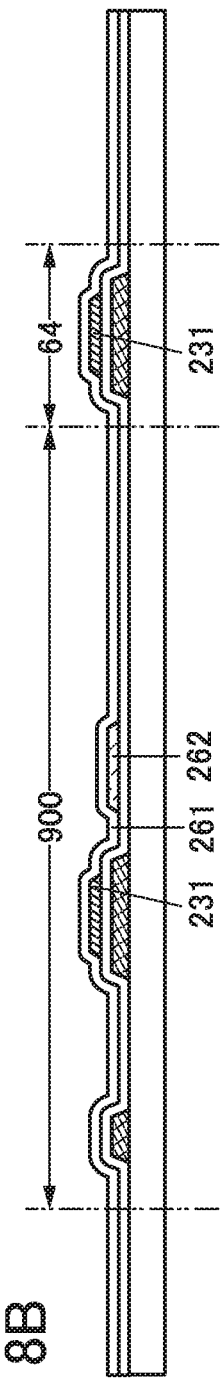
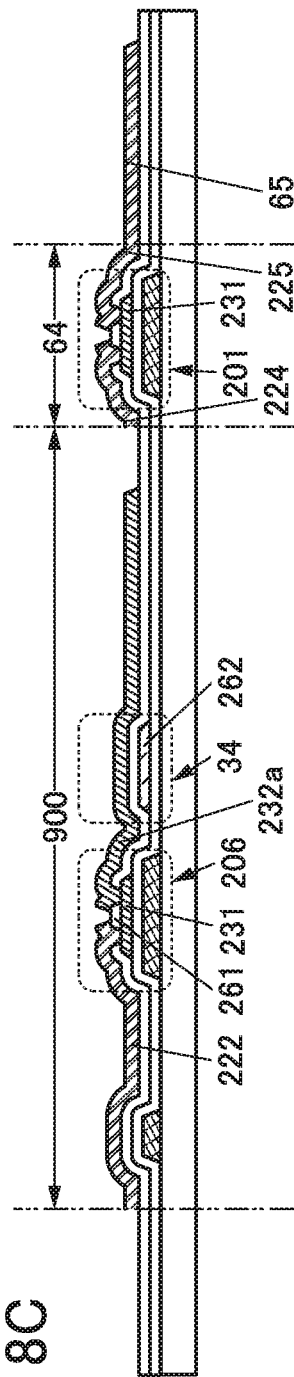

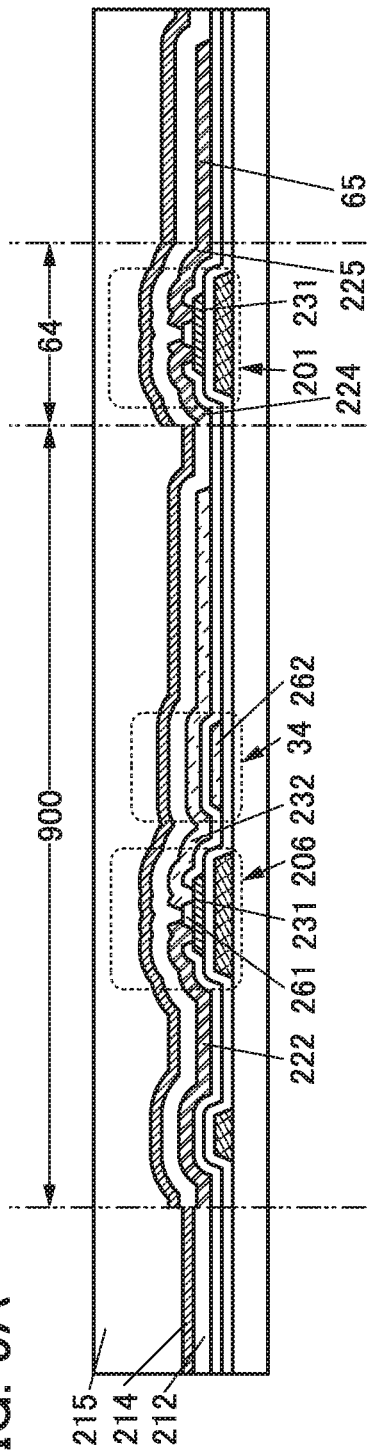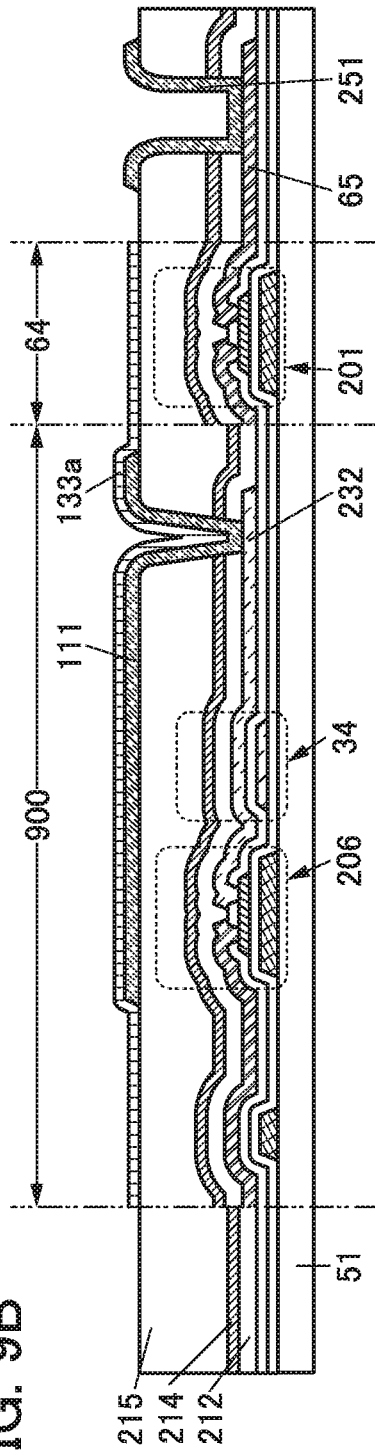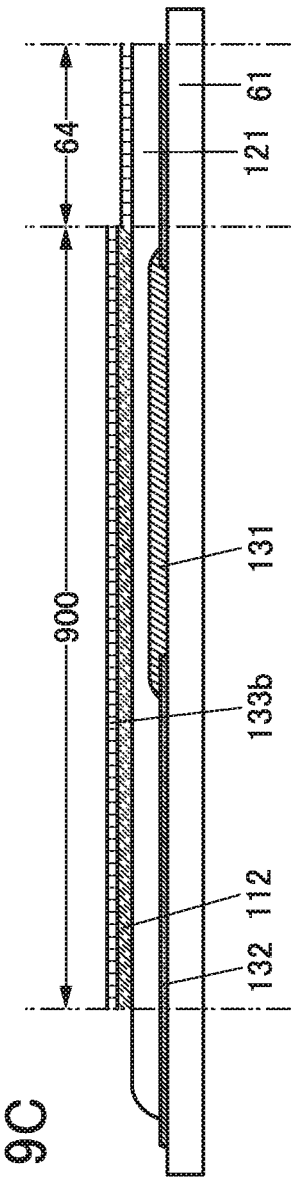

FIG. 16A
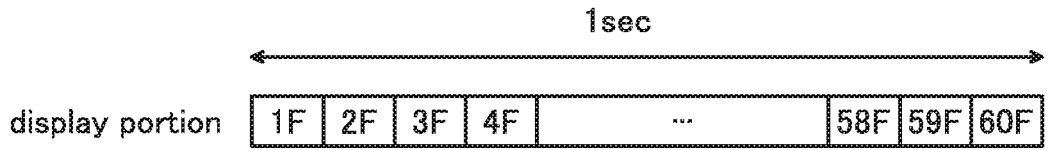
FIG. 16B
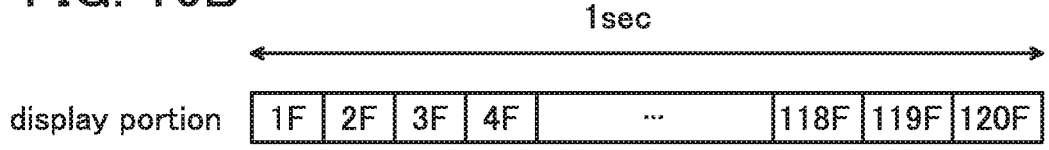
FIG. 16C
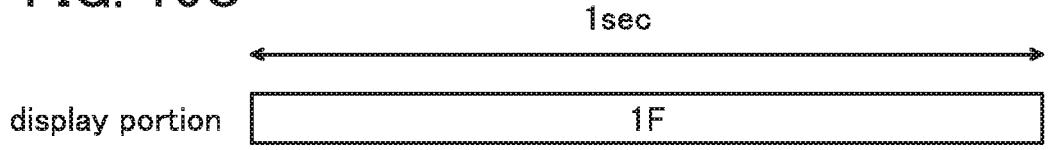
FIG. 16D
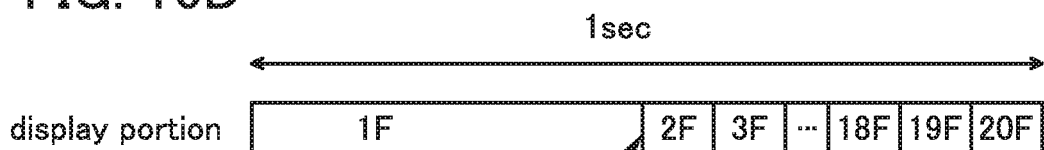

FIG. 17A
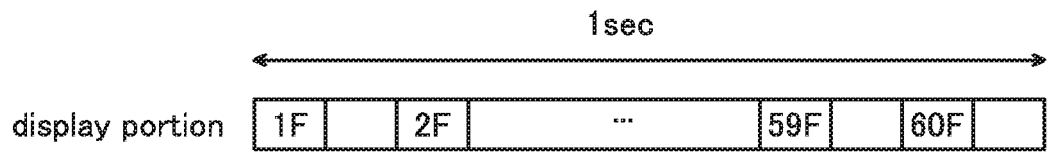
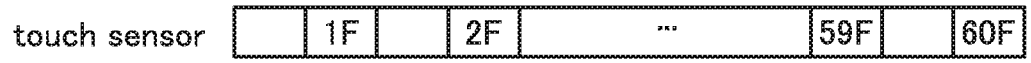
FIG. 17B
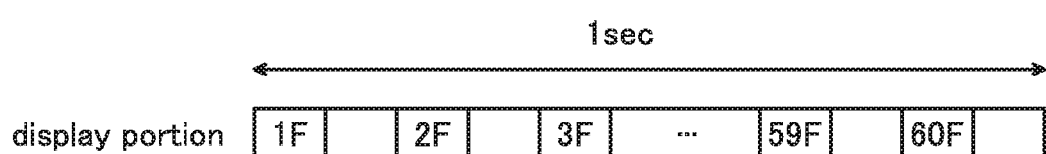
FIG. 17C
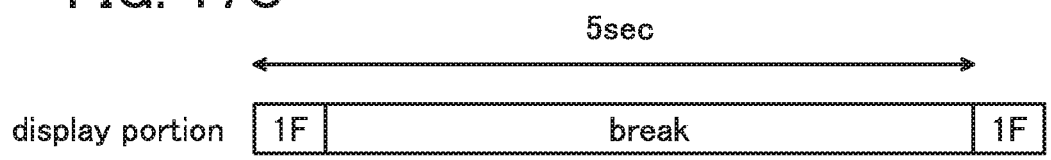
FIG. 17D
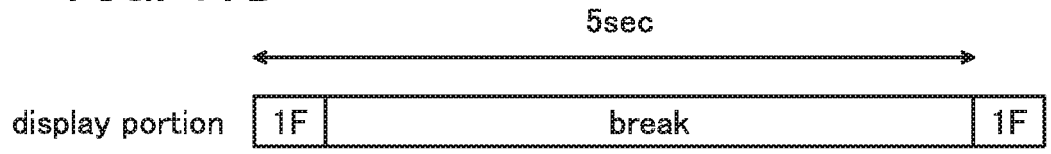

DISPLAY DEVICE, METHOD FOR MANUFACTURING THE SAME, AND ELECTRONIC DEVICE

BACKGROUND OF THE INVENTION

1. Field of the Invention

One embodiment of the present invention relates to a display device, a method for manufacturing the display device, and an electronic device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (such as a touch sensor), an input/output device (such as a touch panel), a method for driving any of them, and a method for manufacturing any of them.

2. Description of the Related Art

Transistors used for most flat panel displays typified by a liquid crystal display device and a light-emitting display device are formed using silicon semiconductors such as amorphous silicon, single crystal silicon, and polycrystalline silicon provided over glass substrates. Furthermore, such a transistor employing such a silicon semiconductor is used in integrated circuits (ICs) and the like.

In recent years, attention has been drawn to a technique in which, instead of a silicon semiconductor, a metal oxide exhibiting semiconductor characteristics is used in transistors. Note that in this specification, a metal oxide exhibiting semiconductor characteristics is referred to as an oxide semiconductor. For example, in Patent Documents 1 and 2, a technique is disclosed in which a transistor is manufactured using zinc oxide or an In—Ga—Zn-based oxide as an oxide semiconductor and the transistor is used as a switching element or the like of a pixel of a display device.

REFERENCE

Patent Document

[Patent Document 1] Japanese Published Patent Application No. 2007-123861
[Patent Document 2] Japanese Published Patent Application No. 2007-096055

SUMMARY OF THE INVENTION

An object of one embodiment of the present invention is to provide a liquid crystal display device with a high aperture ratio and a method for manufacturing the liquid crystal display device. Another object of one embodiment of the present invention is to provide a liquid crystal display device which is formed through a simplified manufacturing process and a method for manufacturing the liquid crystal display device. Another object of one embodiment of the present invention is to provide a liquid crystal display device with low power consumption and a method for manufacturing the liquid crystal display device. Another object of one embodiment of the present invention is to provide a liquid crystal display device with high resolution and a method for manufacturing the liquid crystal display device. Another object of one embodiment of the present invention is to provide a highly reliable liquid crystal display device and a method for manufacturing the liquid crystal display device. Another object of one embodiment of the present invention is to provide a novel liquid crystal display device and a method for manufacturing the liquid crystal display device.

Note that the descriptions of these objects do not disturb the existence of other objects. In one embodiment of the present invention, there is not necessarily a need to achieve all the objects. Other objects can be derived from the description of the specification, the drawings, and the claims.

One embodiment of the present invention is a display device including a transistor and a capacitor. The transistor includes a first insulating layer, a first semiconductor layer in contact with the first insulating layer, a second insulating layer in contact with the first semiconductor layer, and a first conductive layer electrically connected to the first semiconductor layer via an opening portion provided in the second insulating layer. The first semiconductor layer includes a channel region. The capacitor includes a second conductive layer in contact with the first insulating layer, the second insulating layer in contact with the second conductive layer, and the first conductive layer in contact with the second insulating layer. The second conductive layer includes a composition similar to a composition of the first semiconductor layer. The first conductive layer and the second conductive layer are each configured to transmit visible light.

In the above embodiment, the first semiconductor layer, the first conductive layer, and the second conductive layer may each include a metal oxide.

In the above embodiment, the metal oxide of the first semiconductor layer may include one or more of metal elements included in the metal oxide of the first conductive layer.

In the above embodiment, the first conductive layer may include an In—Zn oxide.

In the above embodiment, the second insulating layer may include silicon oxynitride.

The above embodiment further includes a third insulating layer in contact with the second insulating layer and the first conductive layer. The third insulating layer may include oxygen at a higher proportion than a stoichiometric composition.

The above embodiment further includes a liquid crystal element which includes a liquid crystal layer and a pixel electrode. The pixel electrode may be electrically connected to the first conductive layer.

In the above embodiment, the resistivity of the liquid crystal element may be greater than or equal to $1.0 \times 10^{14}$ $\Omega \cdot cm$.

In the above embodiment, the frame frequency of the display device is greater than or equal to 0.1 Hz and less than 60 Hz. The display device may be configured to retain data when the transistor is turned off after the data is written to the capacitor.

In the above embodiment, the frame frequency of the display device may be greater than or equal to 0.1 Hz and less than 20 Hz.

The above embodiment further includes a scan line which is formed using a metal material. The scan line may include a region overlapping with the channel region of the transistor.

One embodiment of the present invention is an electronic device including the display device of one embodiment of the present invention and an operation key.

One embodiment of the present invention is a method for manufacturing a display device, including the steps of forming a first semiconductor layer and a second semiconductor layer; forming a first insulating layer so that the first insulating layer is in contact with the first semiconductor layer and the second semiconductor layer; forming a first opening portion reaching the first semiconductor layer, in the first insulating layer; forming a third semiconductor layer so that the third semiconductor layer overlaps with the second semiconductor layer and is electrically connected to the first semiconductor layer via the first opening portion; forming a second insulating layer so that the second insulating layer is in contact with the first insulating layer and the third semiconductor layer; forming a second opening portion reaching the third semiconductor layer, in the second insulating layer; and forming a pixel electrode so that the pixel electrode is electrically connected to the third semiconductor layer via the second opening portion. The resistance of each of the first semiconductor layer and the second semiconductor layer is reduced in the step of forming the first insulating layer. The resistance of the third semiconductor layer is reduced in the step of forming the second insulating layer. The resistance of a channel region of the first semiconductor layer with the reduced resistance is increased after the second insulating layer is formed.

The first semiconductor layer, the second semiconductor layer, and the third semiconductor layer may be formed so as to include a metal oxide.

The third semiconductor layer may be formed so as to include an In—Zn oxide.

The first insulating layer and the second insulating layer may be formed by a CVD method with use of a deposition gas containing silane.

The deposition gas may include a nitrogen oxide.

Heat treatment may be performed after the second insulating layer is formed.

A liquid crystal layer may be formed after the pixel electrode is formed.

According to one embodiment of the present invention, a liquid crystal display device with a high aperture ratio and a method for manufacturing the liquid crystal display device can be provided. According to one embodiment of the present invention, a liquid crystal display device which is formed through a simplified manufacturing process and a method for manufacturing the liquid crystal display device can be provided. According to one embodiment of the present invention, a liquid crystal display device with low power consumption and a method for manufacturing the liquid crystal display device can be provided. According to one embodiment of the present invention, a liquid crystal display device with high resolution and a method for manufacturing the liquid crystal display device can be provided. According to one embodiment of the present invention, a highly reliable liquid crystal display device and a method for manufacturing the liquid crystal display device can be provided. According to one embodiment of the present invention, a novel liquid crystal display device and a method for manufacturing the liquid crystal display device can be provided.

Note that the description of these effects does not preclude the existence of other effects. One embodiment of the present invention does not necessarily achieve all the effects listed above. Other effects can be derived from the description of the specification, the drawings, and the claims.

BRIEF DESCRIPTION OF THE DRAWINGS

FIGS. 3A1, 3A2, and 3B are top views and a cross-sectional view illustrating an example of a display device.

FIGS. 8A to 8C are cross-sectional views illustrating an example of a method for manufacturing a display device.

FIGS. 9A to 9C are cross-sectional views illustrating an example of a method for manufacturing a display device.

FIGS. 16A to 16D illustrate the operation of a display device and a touch sensor.

FIGS. 17A to 17D illustrate the operation of a display device and a touch sensor.

DETAILED DESCRIPTION OF THE INVENTION

Figure 1A:
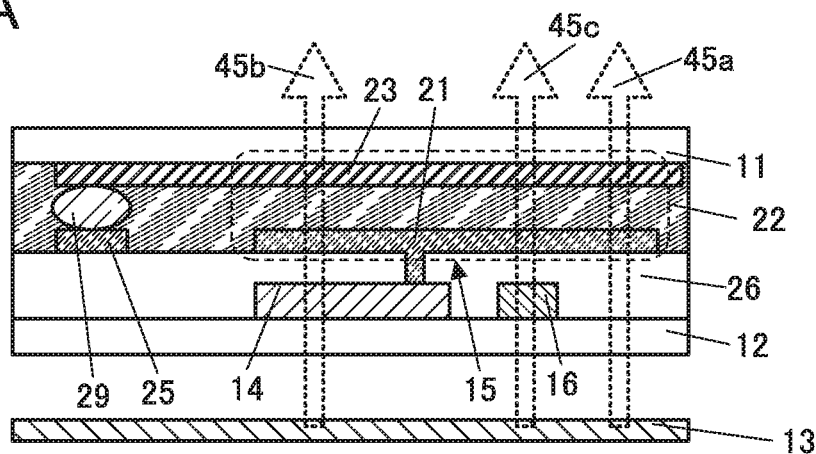
FIGS. 1A and 1B are cross-sectional views each illustrating an example of a display device.

Embodiments will be described in detail with reference to the drawings. Note that one embodiment of the present invention is not limited to the following description. It will be readily appreciated by those skilled in the art that modes and details of the present invention can be modified in various ways without departing from the spirit and scope of the present invention. Therefore, the present invention should not be construed as being limited to the description in the following embodiments.

Note that in structures of the present invention described below, the same portions or portions having similar functions are denoted by the same reference numerals in different drawings, and a description thereof is not repeated. Furthermore, the same hatching pattern is applied to portions having similar functions, and the portions are not especially denoted by reference numerals in some cases.

The position, size, range, or the like of each structure illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film". Also, the term "insulating film" can be changed into the term "insulating layer".

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is called an oxide semiconductor in some cases. In other words, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

Embodiment 1

In this embodiment, a display device of one embodiment of the present invention is described with reference to FIGS. 1A and 1B, FIGS. 2A to 2C, FIGS. 3A1, 3A2, and 3B, FIG. 4, FIG. 5, FIG. 6, FIG. 7, FIGS. 8A to 8C, FIGS. 9A to 9C, FIGS. 10A and 10B, FIGS. 11A and 11B, and FIG. 12.

<1 Structure Example 1 of Display Device>

First, the display device of one embodiment of the present invention is described with reference to FIGS. 1A and 1B, FIGS. 2A to 2C, FIGS. 3A1, 3A2, and 3B, and FIG. 4.

The display device of one embodiment of the present invention includes a display element, a transistor, and a capacitor. The display element can be a liquid crystal element, for example. Although a liquid crystal element is described as the display element in the following description, the display element which is applicable to one embodiment of the present invention is not limited to a liquid crystal element. For example, a light-emitting element having a self-light-emitting function may be used as the display element. As the light-emitting element, it is possible to use, for example, an organic electroluminescent (EL) element, an inorganic EL element, a light-emitting diode (LED), a quantum-dot light-emitting diode (QLED), or a semiconductor laser. Note that an element with a combination of a light source such as a back light or a side light and a transmissive liquid crystal element may be used as the light-emitting element. Alternatively, both a liquid crystal element and a light-emitting element may be used as the display elements.

The liquid crystal element includes a pixel electrode, a liquid crystal layer, and a common electrode. The transistor and the capacitor are electrically connected to the pixel electrode. The pixel electrode, the common electrode, and the capacitor each have a function of transmitting visible light. The visible light passes through the liquid crystal element and is emitted to the outside of the display device.

The display device of one embodiment of the present invention includes a region where the capacitor transmits visible light. Thus, the capacitor can be provided in a display region. Accordingly, the aperture ratio of a pixel can be increased, and the power consumption of the display device can be reduced. In addition, high definition can be achieved in the display device.

The transistor of the display device of one embodiment of the present invention preferably has a channel-protective structure. With the structure, a channel protective layer of the transistor and a dielectric layer of the capacitor can be formed in one process. Thus, the reliability of the transistor can be increased, and the manufacturing process of the display device of one embodiment of the present invention can be simplified.

The display device of this embodiment further includes a scan line and a signal line. Each of the scan line and the signal line is electrically connected to the transistor. Each of the scan line and the signal line includes a metal layer. When a metal layer is used for each of the scan line and the signal line, the resistances of the scan line and the signal line can be reduced.

The scan line preferably includes a portion overlapping with a channel region of the transistor. The characteristics of the transistor might vary by light irradiation depending on a material of the channel region of the transistor. When the scan line includes the portion overlapping with the channel region of the transistor, the channel region can be prevented from being irradiated with external light, light of a backlight, or the like. Thus, the reliability of the transistor can be increased.

A display device 10A illustrated in FIG. 1A includes a substrate 11, a substrate 12, a transistor 14, a liquid crystal element 15, a capacitor 16, and the like. A backlight unit 13 is provided on the substrate 12 side of the display device 10A.

The liquid crystal element 15 includes a pixel electrode 21, a liquid crystal layer 22, and a common electrode 23. The pixel electrode 21 is electrically connected to the transistor 14 through an opening provided in an insulating layer 26. A conductive layer 25 formed using the same step and the same material as those of the pixel electrode 21 is provided over the insulating layer 26. The conductive layer 25 is electrically connected to the common electrode 23 through a connector 29.

Light 45a from the backlight unit 13 is emitted to the outside of the display device 10A through the substrate 12, the insulating layer 26, the pixel electrode 21, the liquid crystal layer 22, the common electrode 23, and the substrate 11. As materials of these layers that transmit the light 45a, visible-light-transmitting materials are used.

Light 45b from the backlight unit 13 is emitted to the outside of the display device 10A through the substrate 12, the transistor 14, the pixel electrode 21, the liquid crystal layer 22, the common electrode 23, and the substrate 11. In this embodiment, the transistor 14 electrically connected to the liquid crystal element 15 has a structure having a region which transmits visible light. Accordingly, a region provided with the transistor 14 can also be used as a display region. Thus, the aperture ratio of the pixel can be increased. As the aperture ratio becomes higher, the light extraction efficiency can be increased. Therefore, the power consumption of the display device can be reduced. Moreover, the display device can have high definition.

Light 45c from the backlight unit 13 is emitted to the outside of the display device 10A through the substrate 12, the capacitor 16, the pixel electrode 21, the liquid crystal layer 22, the common electrode 23, and the substrate 11. In this embodiment, the capacitor 16 has a structure having a region which transmits visible light. Accordingly, a region provided with the capacitor 16 can also be used as a display region. Thus, the aperture ratio of the pixel can be increased. As the aperture ratio becomes higher, the light extraction efficiency can be increased. Therefore, the power consumption of the display device can be reduced. Moreover, the display device can have high definition.

Figure 1B:
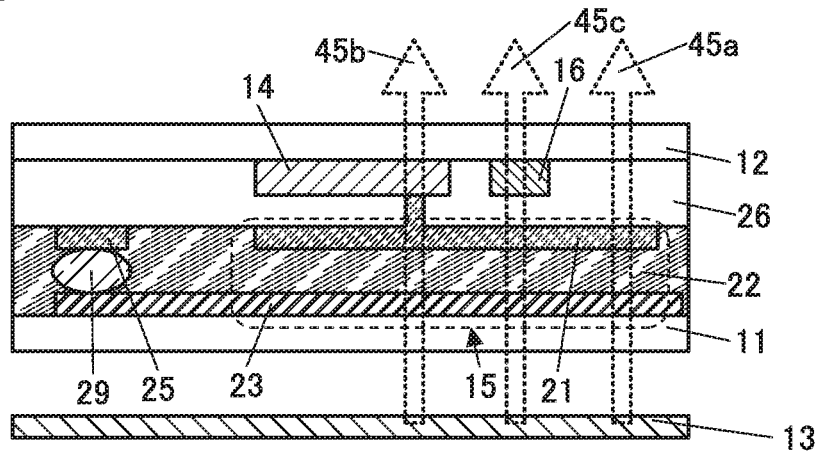

A display device 10B illustrated in FIG. 1B differs from the display device 10A in that the backlight unit 13 is provided on the substrate 11 side. The other structures are similar to those of the display device 10A, and therefore, a description thereof is omitted.

In the display device 10A, the light 45b first enters the visible-light-transmitting region of the transistor 14. Then, the light 45b which has passed through the region enters the liquid crystal element 15. In contrast, in the display device 10B, the light 45b first enters the liquid crystal element 15. Then, the light 45b which has passed through the liquid crystal element 15 enters the region which transmits visible light in the transistor 14. As described above, the light from the backlight unit 13 may first enter either the transistor 14 or the liquid crystal element 15.

In the display device 10A, the light 45c enters the capacitor 16 first. Then, the light 45c which has passed through the region enters the liquid crystal element 15. In contrast, in the display device 10B, the light 45c first enters the liquid crystal element 15. Then, the light 45c which has passed through the liquid crystal element 15 enters the region which transmits visible light in the capacitor 16. As described above, the light from the backlight unit 13 may first enter either the capacitor 16 or the liquid crystal element 15.

A display device of one embodiment of the present invention includes a liquid crystal element, a transistor, a capacitor, and a touch sensor. The liquid crystal element includes a pixel electrode, a liquid crystal layer, and a common electrode. The transistor is electrically connected to the pixel electrode and the capacitor. The touch sensor is located closer to a display surface than the liquid crystal element and the transistor are. The pixel electrode, the common electrode, and the capacitor each have a function of transmitting visible light. The visible light passes through the capacitor and the liquid crystal element and is emitted to the outside of the display device.

The display device of one embodiment of the present invention can be applied to a display device in which a touch sensor is implemented; such a display device is also referred to as an input/output device or a touch panel.

Figure 2A:
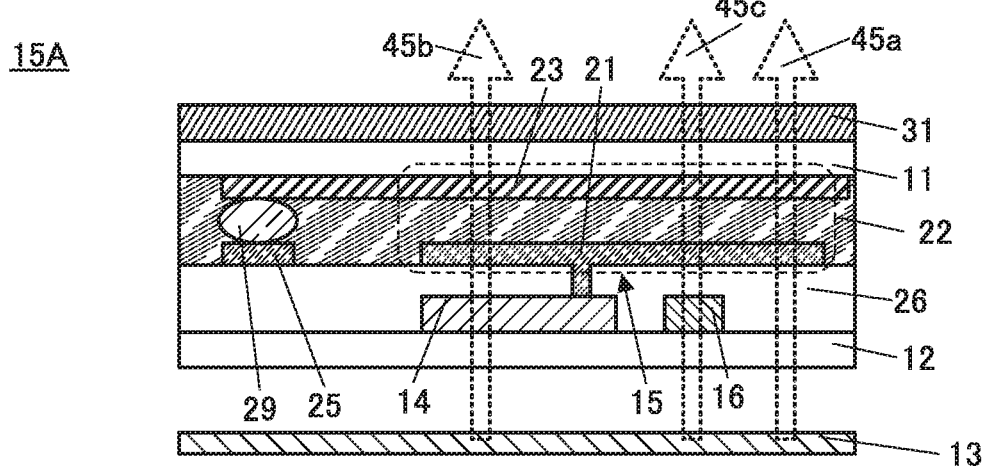
FIGS. 2A to 2C are cross-sectional views each illustrating an example of a display device.

A display device 15A illustrated in FIG. 2A has a structure in which a touch sensor unit 31 is provided on the substrate 11 side of the display device 10A.

Figure 2B:
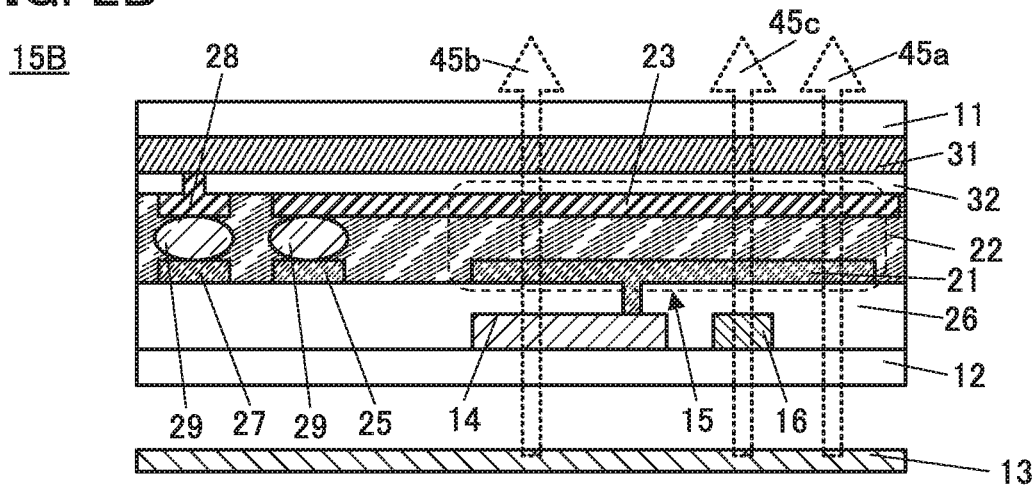

A display device 15B illustrated in FIG. 2B has a structure in which the touch sensor unit 31 and an insulating layer 32 are provided between the substrate 11 and the common electrode 23 of the display device 10A. In addition, the display device 15B includes a conductive layer 27 and a conductive layer 28.

The conductive layer 27 formed using the same process and the same material as those of the pixel electrode 21 is provided over the insulating layer 26. The conductive layer 28 formed using the same process and the same material as those of the common electrode 23 is provided in contact with the insulating layer 32. The conductive layer 28 is electrically connected to the touch sensor unit 31. The conductive layer 28 is electrically connected to the conductive layer 27 through the connector 29. Thus, both a signal for driving the liquid crystal element 15 and a signal for driving the touch sensor unit 31 can be supplied through one or more FPCs connected to the substrate 12 side. There is no need to connect the FPC and the like to the substrate 11 side, and thus the structure of the display device can be more simplified. The display device in FIG. 2B can be incorporated into an electronic device more easily than a display device in which FPCs are connected to both of the substrate 11 side and the substrate 12 side. Furthermore, the number of components can be reduced.

In the display device 15B, the touch sensor unit 31 can be provided between the pair of substrates, so that the number of substrates can be reduced, and the display device can be reduced in weight and thickness.

Figure 2C:
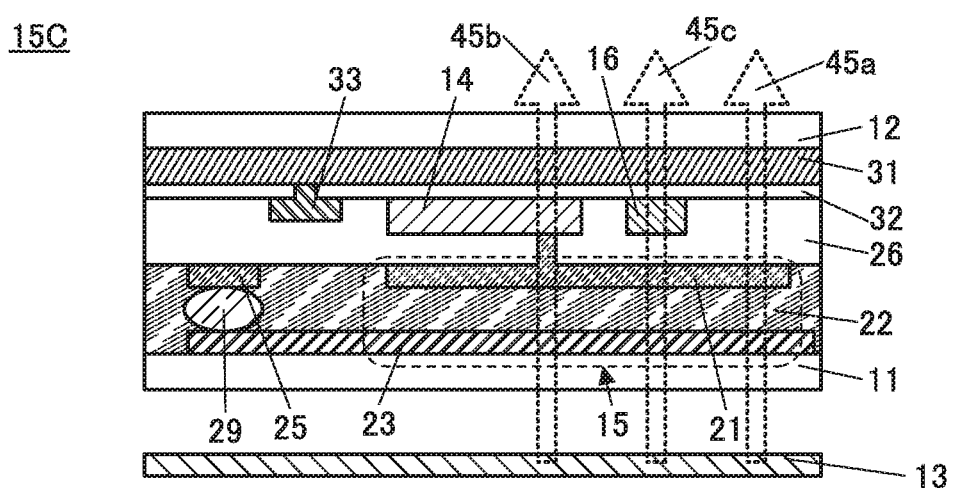

A display device 15C illustrated in FIG. 2C has a structure in which the touch sensor unit 31 and the insulating layer 32 are provided between the substrate 12 and the insulating layer 26 of the display device 10B. In addition, the display device 15C includes a conductive layer 33.

The conductive layer 33 formed using the same process and the same material as one or more conductive layers included in the transistor 14 is provided in contact with the insulating layer 32. The conductive layer 33 is electrically connected to the touch sensor unit 31. In the display device 15C, both a signal for driving the liquid crystal element 15 and a signal for driving the touch sensor unit 31 can be supplied by one or more FPCs connected to the substrate 11 side. Thus, the display device in FIG. 2C can easily be incorporated into an electronic device and allows a reduction in the number of components.

In the display device 15C, the touch sensor unit 31 can be provided between the pair of substrates, so that the number of substrates can be reduced, and the display device can be reduced in weight and thickness.

[Pixel]

Next, a pixel included in the display device of one embodiment of the present invention is described with reference to FIGS. 3A1 to 3B.

FIG. 3A1 is a schematic top view illustrating a pixel 900. The pixel 900 illustrated in FIG. 3A1 includes four subpixels. The pixel 900 illustrated in FIG. 3A1 is an example of a pixel including two-by-two subpixels. In each of the subpixels, a transmissive liquid crystal element 40 (not illustrated in FIGS. 3A1 and 3A2), the transistor 206, the capacitor 34, and the like are provided. In the pixel 900 in FIG. 3A1, two wirings 902 and two wirings 904 are provided. FIG. 3A1 illustrates display regions 918 (display regions 918R, 918G, 918B, and 918W) of liquid crystal elements included in the subpixels.

The pixel 900 includes the wirings 902 and 904, and the like. The wirings 902 function as scan lines, for example. The wirings 904 function as signal lines, for example. The wirings 902 and 904 intersect with each other at a portion.

The transistor 206 functions as a selection transistor. A gate electrode of the transistor 206 is electrically connected to the wiring 902. One of a source electrode and a drain electrode of the transistor 206 is electrically connected to the wiring 904, and the other of the source electrode and the drain electrode of the transistor 206 is electrically connected to the liquid crystal element 40 and the capacitor 34.

Here, the wirings 902 and 904 have a light-blocking property. It is preferable to use a light-transmitting film for layers other than the wirings 902 and 904, i.e., the transistor 206 and layers forming a wiring connected to the transistor 206, the capacitor 34, and the like. FIG. 3A2 distinctively illustrates a visible-light-transmitting region 900t and a visible-light-blocking region 900s included in the pixel 900 in FIG. 3A1. When the transistor is formed using a light-transmitting film as described above, a portion other than the portion provided with the wirings can be the transmissive region 900t. The transmissive region of the liquid crystal element can overlap with the transistor, the wirings connected to the transistor, the capacitor, and the like, so that the aperture ratio of the pixel can be increased.

Note that as the proportion of the area of the transmissive region with respect to the area of the pixel becomes higher, the amount of transmitted light can be increased. The proportion of the area of the transmissive region with respect to the area of the pixel can be higher than or equal to 1% and lower than or equal to 95%, preferably higher than or equal to 10% and lower than or equal to 90%, further preferably higher than or equal to 20% and lower than or equal to 80%, for example. In particular, the proportion is preferably higher than or equal to 40% or higher than or equal to 50%, further preferably higher than or equal to 60% and lower than or equal to 80%.

Figure 4:
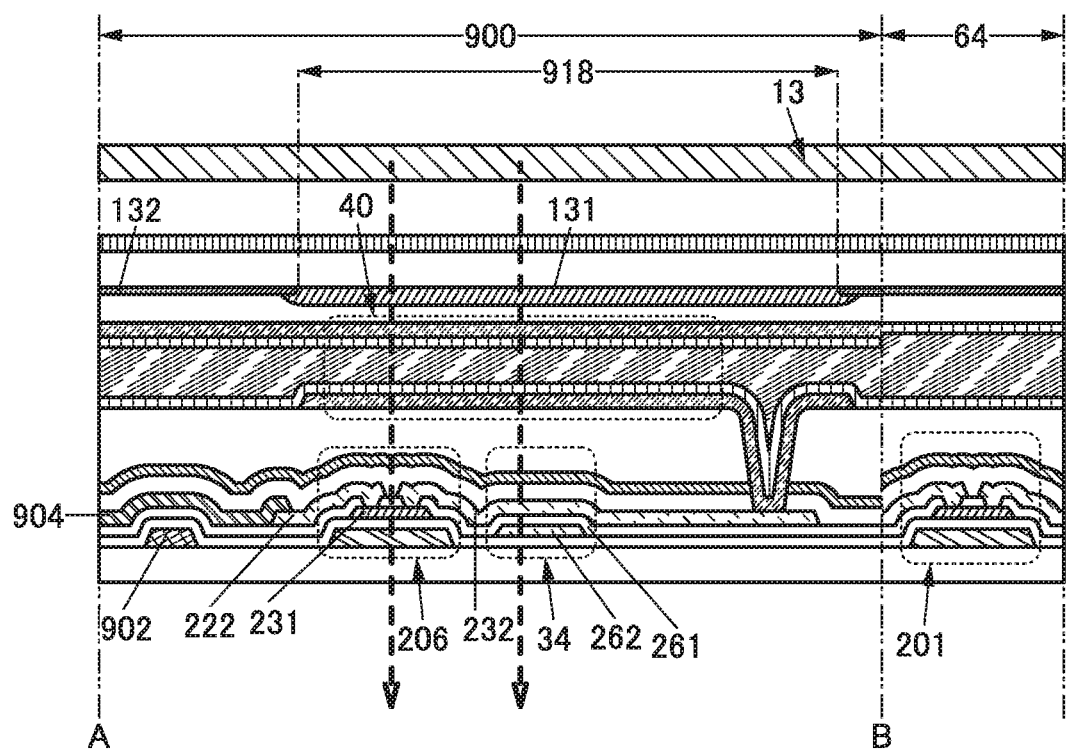
FIG. 4 is a cross-sectional view illustrating an example of a display device.

FIG. 3B and FIG. 4 are each a cross-sectional view taken along dashed-dotted line A-B in FIG. 3A2. Note that cross sections of the liquid crystal element 40, a coloring layer 131, a light-blocking layer 132, a driver circuit portion 64, and the like, which are not illustrated in the top views, are also illustrated in FIG. 3B and FIG. 4. The driver circuit portion 64 can be used as a scan line driver circuit portion or a signal line driver circuit portion. The driver circuit portion 64 includes a transistor 201.

It is preferable that the transistor 206 be a channel-protective transistor. In that case, an insulating layer 261 which functions as a channel protective layer is provided in contact with a semiconductor layer 231 which includes a channel region. An opening portion is provided in the insulating layer 261. The semiconductor layer 231 and a conductive layer 222 which functions as one of a source and a drain of the transistor 206 are electrically connected to each other via the opening portion. In addition, another opening portion is provided in the insulating layer 261. The semiconductor layer 231 and a conductive layer 232 which functions as the other of the source and the drain of the transistor 206 are electrically connected to each other via the opening portion. Note that in the semiconductor layer 231, the resistance of a connection portion with the conductive layer 222 and the resistance of a connection portion with the conductive layer 232 are preferably reduced.

The capacitor 34 includes a conductive layer 262, the insulating layer 261, and the conductive layer 232. The conductive layer 262 functions as a first electrode of the capacitor 34. The insulating layer 261 functions as a dielectric layer of the capacitor 34. The conductive layer 262 functions as a second electrode of the capacitor 34. That is, the conductive layer 232 functions as the other of the source and the drain of the transistor 206 and as the second electrode of the capacitor 34. The insulating layer 261 functions as the channel protective layer for the transistor 206 and as the dielectric of the capacitor 34. Note that the first electrode and the second electrode of the capacitor 34 can serve as, for example, a lower electrode and an upper electrode, respectively.

The conductive layer 262 and the semiconductor layer 231 can be formed in the same layer. Specifically, a semiconductor layer is formed and is processed by a lithography method or the like, and the resistance of the semiconductor layer which is formed in the capacitor 34 is reduced, whereby the conductive layer 262 can be formed. In that case, the conductive layer 262 has a composition similar to that of the semiconductor layer 231. Examples of a lithography method include a method in which a resist mask is formed over a thin film to be processed, the thin film is processed by etching or the like, and the resist mask is removed, and a method in which a photosensitive thin film is formed and exposed to light and developed to be processed into a desired shape.

In this manner, when the transistor in the display device of one embodiment of the present invention is a channel-protective transistor, the channel region of the semiconductor layer can be prevented from being damaged by etching at the time of formation of the source and the drain of the transistor, for example. Accordingly, the electrical characteristics of the transistor can be stabilized to achieve high reliability of the transistor.

In the display device of one embodiment of the present invention, the first electrode of the capacitor can be formed in the same process as that of the semiconductor layer of the transistor. The dielectric layer of the capacitor can be formed in the same process as that of the channel protective layer of the transistor. The second electrode of the capacitor can be formed in the same process as that of the source or the drain of the transistor. Thus, the manufacturing process of the display device of one embodiment of the present invention can be simplified, so that the manufacturing costs can be reduced.

As illustrated in each of FIG. 3B and FIG. 4, light is emitted from the backlight unit 13 in a direction shown by an arrow of a broken line. The light from the backlight unit 13 is extracted to the outside through the transistor 206, the capacitor 34, or the like. Accordingly, films forming the transistor 206 and the capacitor 34, and the like also preferably have a light-transmitting property. As the area of the light-transmitting region included in the transistor 206, the capacitor 34, and the like becomes larger, light from the backlight unit 13 can be used more efficiently.

As illustrated in each of FIG. 3B and FIG. 4, the light from the backlight unit 13 may be extracted to the outside through the coloring layer 131. When the light is extracted through the coloring layer 131, light having a desired color can be obtained. The color of the coloring layer 131 can be selected from red (R), green (G), blue (B), cyan (C), magenta (M), yellow (Y), and the like.

In FIG. 3B, the light from the backlight unit 13 first enters the transistor 206, the capacitor 34, or the like. Then, the light which has passed through the transistor 206, the capacitor 34, or the like enters the liquid crystal element 40. After that, the light which has passed through the liquid crystal element 40 is extracted to the outside through the coloring layer 131.

In FIG. 4, light from the backlight unit 13 first enters the coloring layer 131. Then, the light which has passed through the coloring layer 131 enters the liquid crystal element 40. After that, the light which has passed through the liquid crystal element 40 is extracted to the outside through the transistor 206, the capacitor 34, or the like.

For the transistor, the wiring, the capacitor, and the like illustrated in FIGS. 3A1 to 3B, the following materials can be used. Note that these materials can also be used for the visible-light-transmitting semiconductor layer and the visible-light-transmitting conductive layer in each structure example described in this embodiment.

The semiconductor layer included in the transistor can be formed using a light-transmitting semiconductor material. As a light-transmitting semiconductor material, a metal oxide, an oxide semiconductor, and the like can be given. Note that an oxide semiconductor preferably contains at least indium. In particular, indium and zinc are preferably contained. In addition, one or more kinds of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

The conductive layer included in the transistor and the capacitor can be formed using a light-transmitting conductive material. A light-transmitting conductive material preferably includes one or more kinds selected from indium, zinc, and tin. Specifically, an In oxide, an In—Sn oxide (also referred to as an indium tin oxide or ITO), an In—Zn oxide, an In—W oxide, an In—W—Zn oxide, an In—Ti oxide, an In—Sn—Ti oxide, an In—Sn—Si oxide, a Zn oxide, a Ga—Zn oxide, or the like can be used.

The conductive layer included in the transistor and the capacitor may be an oxide semiconductor that includes an impurity element and has reduced resistance. The oxide semiconductor with the reduced resistance can be regarded as an oxide conductor (OC).

For example, to form an oxide conductor, oxygen vacancies are formed in an oxide semiconductor and then hydrogen is added to the oxygen vacancies, so that a donor level is formed in the vicinity of the conduction band. The oxide semiconductor having the donor level has an increased conductivity and becomes a conductor.

An oxide semiconductor has a large energy gap (e.g., an energy gap of 2.5 eV or larger), and thus has a visible light transmitting property. Moreover, as described above, an oxide conductor is an oxide semiconductor having a donor level in the vicinity of the conduction band. Therefore, the influence of absorption due to the donor level is small in an oxide conductor, and an oxide conductor has a visible light transmitting property comparable to that of an oxide semiconductor.

The oxide conductor preferably includes one or more kinds of metal elements included in the semiconductor layer of the transistor. When two or more layers included in the transistor are formed using the oxide semiconductors including the same metal element, the same manufacturing apparatus (e.g., deposition apparatus or processing apparatus) can be used in two or more steps and manufacturing cost can thus be reduced.

The structure of the pixel in the display device described in this embodiment enables efficient use of light emitted from the backlight unit. Thus, the excellent display device with reduced power consumption can be provided.

<2. Structure Example 2 of Display Device>

Figure 5:
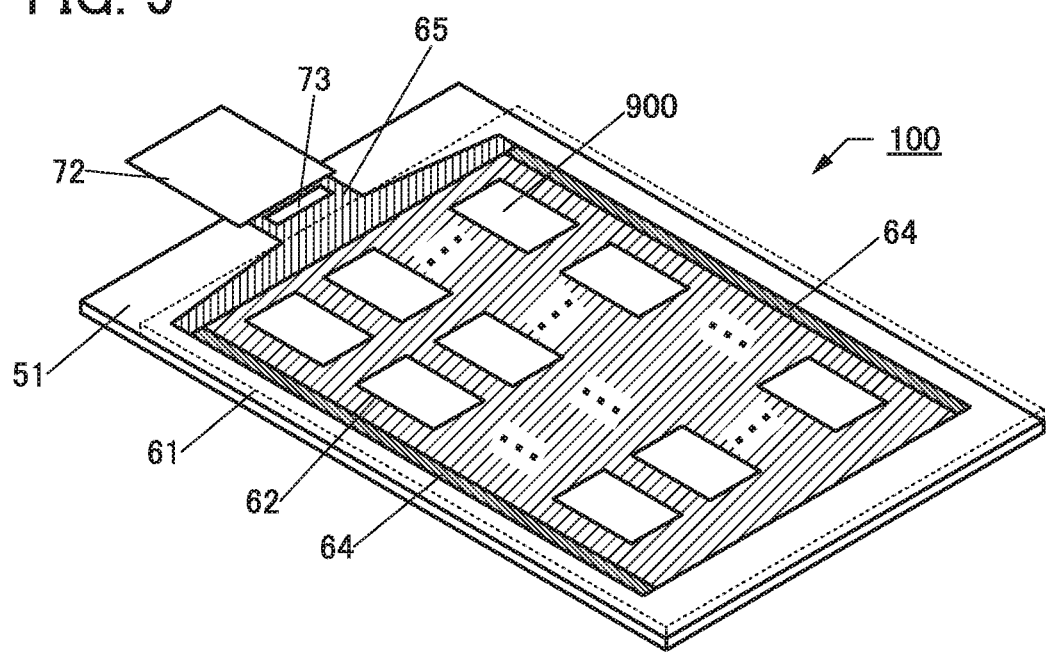
FIG. 5 is a perspective view illustrating an example of a display device.
Figure 6:
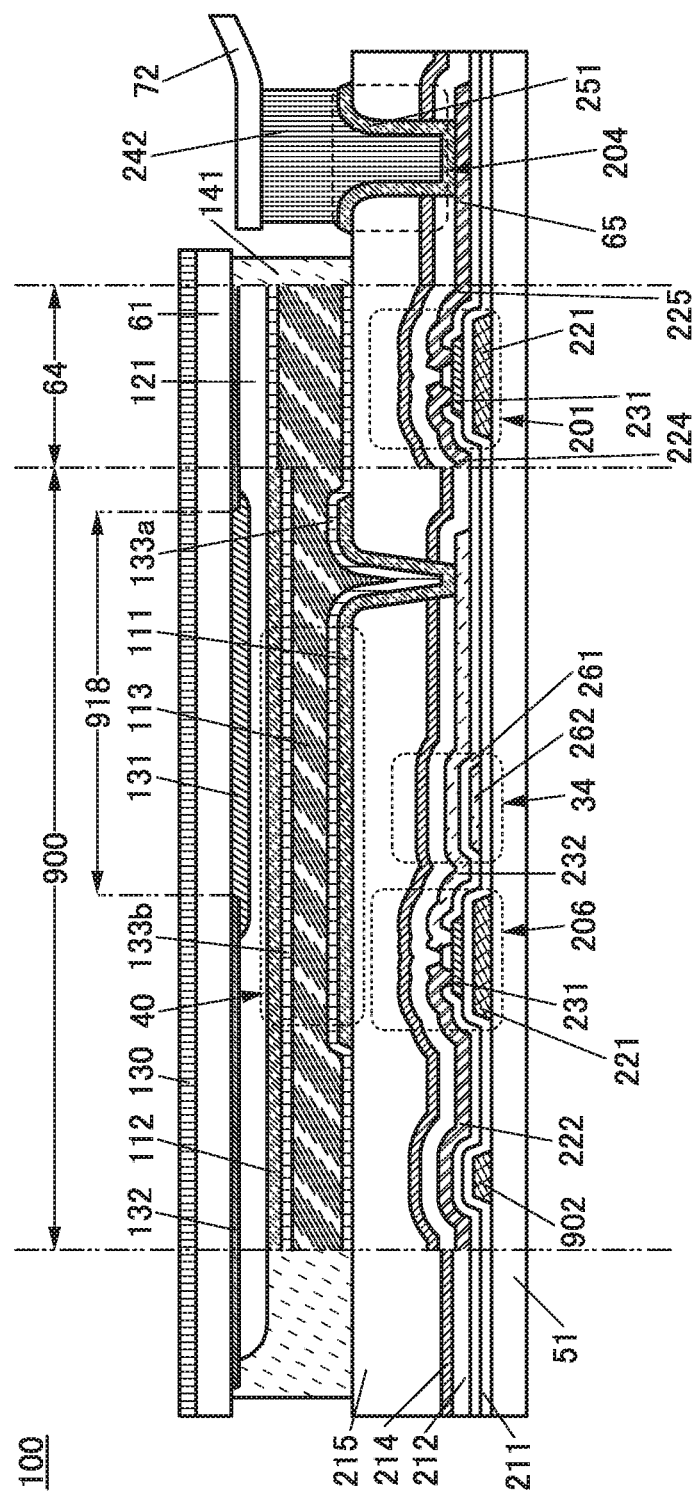
FIG. 6 is a cross-sectional view illustrating an example of a display device.

Next, a display device of one embodiment of the present invention is described with reference to FIG. 5, FIG. 6, and FIG. 7. FIG. 5 is a perspective view illustrating a display device 100. FIG. 6 is a cross-sectional view illustrating the display device 100. FIG. 5 illustrates a substrate 61 with a dotted line.

The display device 100 includes a display portion 62 and the driver circuit portion 64. An FPC 72 and an IC 73 are implemented on the display device 100.

The display portion 62 includes a plurality of pixels 900 and has a function of displaying images.

The pixel 900 includes a plurality of sub-pixels. For example, the display portion 62 can display a full-color image by having one pixel be composed of three subpixels: a subpixel exhibiting a red color, a subpixel exhibiting a green color, and a subpixel exhibiting a blue color. Note that the color exhibited by subpixels is not limited to red, green, and blue. A pixel may be composed of subpixels that exhibit colors of white, yellow, magenta, or cyan, for example. In this specification and the like, a subpixel may be simply described as a pixel.

The display device 100 may include one or both of a scan line driver circuit and a signal line driver circuit. The display device 100 may include none of the scan line driver circuit and the signal line driver circuit. When the display device 100 includes a sensor such as a touch sensor, the display device 100 may include a sensor driver circuit. In this embodiment, the driver circuit portion 64 is exemplified as including the scan line driver circuit. The scan line driver circuit has a function of outputting scan signals to the scan lines included in the display portion 62.

In the display device 100, the IC 73 is mounted on a substrate 51 by a COG method or the like. The IC 73 includes, for example, any one or more of a signal line driver circuit, a scan line driver circuit, and a sensor driver circuit.

The FPC 72 is electrically connected to the display device 100. The IC 73 and the driver circuit portion 64 are supplied with signals or power from the outside through the FPC 72. Furthermore, signals can be output to the outside from the IC 73 through the FPC 72.

An IC may be mounted on the FPC 72. For example, an IC including any one or more of a signal line driver circuit, a scan line driver circuit, and a sensor driver circuit may be mounted on the FPC 72.

A wiring 65 supplies signals and power to the display portion 62 and the driver circuit portion 64. The signals and power are input to the wiring 65 from the outside through the FPC 72, or from the IC 73.

FIG. 6 is a cross-sectional view including the pixel 900 and the driver circuit portion 64. As illustrated in FIG. 6, the display device 100 includes the substrate 51, the transistor 201, the transistor 206, the liquid crystal element 40, an alignment film 133a, an alignment film 133b, a connection portion 204, an adhesive layer 141, the coloring layer 131, the light-blocking layer 132, an overcoat 121, the substrate 61, and the like.

The liquid crystal element 40 includes a pixel electrode 111, a common electrode 112, and a liquid crystal layer 113. The alignment of the liquid crystal layer 113 can be controlled with the electric field generated between the pixel electrode 111 and the common electrode 112. The liquid crystal layer 113 is positioned between the alignment films 133a and 133b.

In FIG. 6, the pixel electrode 111 is electrically connected to the conductive layer 232. As described above, the conductive layer 232 functions as the other of the source electrode and the drain electrode of the transistor 206 and as the second electrode of the capacitor 34, and is formed using a material which transmits visible light. The conductive layer 262 that functions as the first electrode of the capacitor 34 is also formed using a material which transmits visible light. Therefore, a region where the capacitor 34 is provided can serve as the display region 918. Thus, the aperture ratio of the pixel 900 can be increased, and the power consumption of the display device 100 can be reduced.

In FIG. 6, alignment films are provided in contact with the liquid crystal layer 113. The alignment films can control the alignment of the liquid crystal layer 113. In FIG. 6, the alignment film 133a is provided in contact with the pixel electrode 111, and the alignment film 133b is provided in contact with the common electrode 112. Note that the alignment film 133a and/or the alignment film 133b are/is not necessarily provided.

The liquid crystal material is classified into a positive liquid crystal material with a positive dielectric anisotropy ($\Delta\varepsilon$) and a negative liquid crystal material with a negative dielectric anisotropy. Both of the materials can be used in one embodiment of the present invention, and an optimal liquid crystal material can be selected according to the employed mode and design.

In one embodiment of the present invention, a negative liquid crystal material is preferably used. The negative liquid crystal is less affected by a flexoelectric effect, which is attributed to the polarization of liquid crystal molecules, and thus the polarity makes little difference in transmittance. This prevents flickering from being recognized by the user of the display device. The flexoelectric effect is a phenomenon in which polarization is induced by the distortion of orientation, and mainly depends on the shape of a molecule. The negative liquid crystal material is less likely to experience the deformation such as spreading and bending.

Note that a liquid crystal element using any of a variety of modes can be used as the liquid crystal element 40. For example, a liquid crystal element using a fringe field switching (FFS) mode, a vertical alignment (VA) mode, a twisted nematic (TN) mode, an in-plane switching (IPS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, an electrically controlled birefringence (ECB) mode, a VA-IPS mode, or a guest-host mode can be used.

Furthermore, the display device 100 may be a normally black liquid crystal display device, for example, a transmissive liquid crystal display device using a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element is an element that controls transmission and non-transmission of light by optical modulation action of the liquid crystal. The optical modulation action of liquid crystal is controlled by an electric field applied to the liquid crystal (including a horizontal electric field, a vertical electric field, and an oblique electric field). For example, when the optical modulation action of liquid crystal is controlled by an horizontal electric field, the control mode can be called a horizontal electric field mode. As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 wt. % or more of a chiral material is mixed is used for the liquid crystal layer 113 in order to improve the temperature range. The liquid crystal composition that includes a liquid crystal exhibiting a blue phase and a chiral material has a short response time and exhibits optical isotropy, which makes the alignment process unnecessary. In addition, the liquid crystal composition that includes a liquid crystal exhibiting a blue phase and a chiral material has little viewing angle dependence. In addition, since an alignment film does not need to be provided and rubbing treatment is unnecessary, electrostatic discharge damage caused by the rubbing treatment can be prevented and defects or damage of the liquid crystal display device in the manufacturing process can be reduced.

As the display device 100 is a transmissive liquid crystal display device, a conductive material that transmits visible light is used for one or both of the pixel electrode 111 and the common electrode 112. In addition, a conductive material which transmits visible light is used for one or both of the conductive layers 232 and 262.

For example, a material containing one or more of indium (In), zinc (Zn), and tin (Sn) is preferably used for the visible-light-transmitting conductive material. Specifically, indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide containing silicon oxide (ITSO), zinc oxide, and zinc oxide containing gallium are given, for example. Note that a film including graphene can be used as well. The film including graphene can be formed, for example, by reducing a film containing graphene oxide.

An oxide conductor is preferably used for one or more of the conductive layer 232, the conductive layer 262, the pixel electrode 111, and the common electrode 112. The oxide conductor preferably includes one or more metal elements that are included in the semiconductor layer 231 of the transistor 206. For example, the conductive layer 262 preferably contains indium and is further preferably the In-M-Zn oxide (M is Al, Ti, Ga, Ge, Y, Zr, La, Ce, Sn, Mg, Nd, or Hf) film. The conductive layer 232 is preferably an In—Zn oxide film. When the conductive layer 232 is an In—Zn oxide film, an increase in the resistance of the conductive layer 232 which is caused in the manufacturing process of the display device 100 can be prevented. Details thereof will be described later.

One or more of the conductive layer 232, the conductive layer 262, the pixel electrode 111, and the common electrode 112 may be formed using an oxide semiconductor. When two or more layers constituting the display device are formed using oxide semiconductors containing the same metal element, the same manufacturing equipment (e.g., film-formation equipment or processing equipment) can be used in two or more steps; manufacturing cost can thus be reduced.

An oxide semiconductor is a semiconductor material whose resistance can be controlled by oxygen vacancies in the film of the semiconductor material and/or the concentration of impurities such as hydrogen or water in the film of the semiconductor material. Thus, the resistivity of the oxide conductive can be controlled by performing treatment for increasing oxygen vacancies and/or impurity concentration on the oxide semiconductor, or treatment for reducing oxygen vacancies and/or impurity concentration on the oxide semiconductor. Treatment for increasing oxygen vacancies and/or the impurity concentration are/is performed on the oxide semiconductor, whereby an oxide conductor whose resistance is lowered as compared to the oxide semiconductor can be formed.

Note that such an oxide conductor formed using an oxide semiconductor can be referred to as an oxide semiconductor having a high carrier density and a low resistance, an oxide semiconductor having conductivity, or an oxide semiconductor having high conductivity.

In addition, the manufacturing costs can be reduced by forming the oxide semiconductor and the oxide conductor using the same metal element. For example, the manufacturing costs can be reduced by using a metal oxide target with the same metal composition. By using the metal oxide target with the same metal composition, an etching gas or an etchant used in the processing of the oxide semiconductor can also be used for processing of the oxide conductor. Note that even when the oxide semiconductor and the oxide conductor have the same metal elements, the compositions of the metal elements are different in some cases. For example, metal elements in the film can desorb during the fabrication process of the display device, which results in a different metal composition.

The transistor 206 includes a gate electrode 221, an insulating layer 211, the semiconductor layer 231, the insulating layer 261, the conductive layer 222, and the conductive layer 232. For example, the semiconductor layer 231 preferably includes indium and is further preferably an In-M-Zn oxide (M is Al, Ti, Ga, Ge, Y, Zr, La, Ce, Nd, Sn, or Hf) film.

The gate electrode 221 and the semiconductor layer 231 overlap with the insulating layer 211 positioned therebetween. Specifically, the gate electrode 221 has a region which overlaps with the channel region of the semiconductor layer 231 with the insulating layer 211 positioned therebetween.

The semiconductor layer 231 is provided in contact with the insulating layer 211. The insulating layer 261 is provided in contact with the semiconductor layer 231 and the insulating layer 211. The conductive layer 222 is electrically connected to the semiconductor layer 231 via an opening portion provided in the insulating layer 261. The conductive layer 232 is electrically connected to the semiconductor layer 231 via an opening portion provided in the insulating layer 261.

The insulating layer 211 functions as a gate insulating layer of the transistor 206. The semiconductor layer 231 includes the channel region. The insulating layer 261 functions as a channel protective layer of the transistor 206. The conductive layer 222 function as one of the source and drain electrodes of the transistor 206. The conductive layer 232 functions as the other of the source electrode and the drain electrode of the transistor 206.

The gate electrode 221 can serve as part of a scan line. In other words, the scan line can have a portion which overlaps with the channel region of the transistor 206. The conductive layer 222 can serve as part of a signal line. Accordingly, the electrical resistances of the gate electrode 221 and the conductive layer 222 are preferably sufficiently low. Therefore, the gate electrode 221 and the conductive layer 222 are preferably formed using metal, an alloy, or the like. A material which blocks visible light may be used for the gate electrode 221 and the conductive layer 222.

As described above, a material having a function of transmitting visible light is preferably used for the conductive layer 232. That is, the conductive layer 222 and the conductive layer 232 in the transistor 206 can be formed using different materials in one embodiment of the present invention.

Specifically, a conductive material which transmits visible light and can be used for the conductive layer 232 or the like can have larger resistivity than a conductive material which blocks visible light, such as copper or aluminum. Therefore, to prevent signal delay, bus lines such as scan lines and signal lines are preferably formed using a conductive material which has low resistivity and blocks visible light, e.g., a metal material such as copper. That is, the gate electrode 221 and the conductive layer 222 are preferably formed using a metal material such as copper. Note that a conductive material which transmits visible light can be used for bus lines depending on the size of pixels, the widths and thicknesses of the bus lines, or the like.

The use of a conductive layer blocking visible light for the gate electrode 221 can prevent irradiation of the semiconductor layer 231 with light from the backlight, which can reduce variations in characteristics of the transistor and increase the reliability.

Since the light-blocking layer 132 is provided on the substrate 61 side of the semiconductor layer 231 and the gate electrode 221 blocking visible light is provided on the substrate 51 side of the semiconductor layer 231, the semiconductor layer 231 can be prevented from being irradiated with external light and light from the backlight.

In one embodiment of the present invention, the conductive layer blocking visible light may overlap with part of the semiconductor layer 231 and does not necessarily overlap with the other part of the semiconductor layer 231. For example, the conductive layer blocking visible light may overlap with at least the channel region of the semiconductor layer 231.

The transistor 206 is covered with the insulating layers 212, 214, and 215. Note that insulating layers 212, 214, and 215 can be considered as the component of the transistor 206. The insulating layer 215 functions as a planarization layer.

The insulating layer 212 preferably contains oxygen at a higher proportion than the stoichiometric composition. In addition, the insulating layer 214 and the insulating layer 215 may each contain oxygen at a higher proportion than the stoichiometric composition. Part of oxygen contained in the insulating layer 212 and the like passes through the insulating layer 261 and is supplied to the channel region of the semiconductor layer 231 by heat treatment or the like. Accordingly, in the case where the channel region of the semiconductor layer 231 is an oxide semiconductor, oxygen vacancies of the channel region can be reduced. Therefore, the resistance of the channel region of the semiconductor layer 231 can be increased, variation in the electrical characteristics of the transistor can be prevented, and the reliability can be improved.

For example, in the case where an oxide conductor is used for the conductive layer 262, oxygen contained in the insulating layer 212 and the like diffuses into the conductive layer 262, so that the resistance of the conductive layer 262 might be increased. However, the conductive layer 232 is formed using a material which is less likely to be permeable to oxygen. Accordingly, the oxygen contained in the insulating layer 212 does not easily supplied to the conductive layer 262. Therefore, even in the case where an oxide conductor is used for the conductive layer 262, the increase in the resistance of the conductive layer 262 can be inhibited.

In the display device 100, the coloring layer 131 and the light-blocking layer 132 are provided closer to the substrate 61 than liquid crystal layer 113 is. The coloring layer 131 is positioned in a region that overlaps with at least the display region 918 of the pixel 900. The light-blocking layer 132 is provided in a portion other than the display region 918 (a non-display region). The light-blocking layer 132 overlaps with at least a part of the transistor 206.

The overcoat 121 is preferably provided between the liquid crystal layer 113 and each of the coloring layer 131 and the light-blocking layer 132. The overcoat 121 can reduce the diffusion of an impurity contained in the coloring layer 131 and the light-blocking layer 132 and the like into the liquid crystal layer 113.

The substrates 51 and 61 are bonded to each other with the adhesion layer 141. The liquid crystal layer 113 is encapsulated in a region that is surrounded by the substrates 51 and 61, and the adhesive layer 141.

When the display device 100 functions as a transmissive liquid crystal display device, two polarizing plates are positioned in a way that the pixel 900 is sandwiched between the two polarizing plates. FIG. 6 illustrates the polarizing plate 130 on the substrate 61 side. Light from a backlight provided on the outside of the polarizing plate on the substrate 51 side enters the display device 100 through the polarizing plate. In this case, the optical modulation of the light can be controlled by controlling the alignment of the liquid crystal layer 113 with a voltage supplied between the pixel electrode 111 and the common electrode 112. That is, the intensity of light emitted through the polarizing plate 130 can be controlled. Furthermore, the coloring layer 131 absorbs light of wavelengths other than a specific wavelength range from the incident light. As a result, the ejected light is light that exhibits red, blue, or green colors, for example.

In addition to the polarizing plate, a circularly polarizing plate can be used, for example. An example of a circularly polarizing plate is a stack including a linear polarizing plate and a quarter-wave retardation plate. The circular polarizing plate can reduce the viewing angle dependence of the display quality of the display device.

The liquid crystal element 40 is preferably driven in a guest-host liquid crystal mode. When the guest-host liquid crystal mode is used, a polarizing plate does not need to be used. Since absorption of light by a polarizing plate can be eliminated, light extraction efficiency can be increased, and bright display of the display device can be achieved.

The driver circuit portion 64 includes the transistor 201.

The transistor 201 includes the gate electrode 221, the insulating layer 211, the semiconductor layer 231, the insulating layer 261, a conductive layer 224, and a conductive layer 225. One of the conductive layers 224 and 225 functions as a source electrode, and the other thereof functions as a drain electrode. An opening portion is provided in the insulating layer 261. The conductive layer 224 and the semiconductor layer 231 are electrically connected to each other via the opening portion. Another opening portion is provided in the insulating layer 261. The conductive layer 225 and the semiconductor layer 231 are electrically connected to each other via the opening portion. Note that in the semiconductor layer 231, the resistance of a connection portion with the conductive layer 224 and the resistance of a connection portion with the conductive layer 225 are preferably reduced.

The transistor provided in the driver circuit portion 64 does not need to have a function of transmitting visible light. In other words, the conductive layers 224 and 225 can be formed using a metal material or the like. Specifically, the same material as that of conductive layer 222 can be used. In addition, the conductive layer 224, the conductive layer 225, and the conductive layer 222 can be formed in the same process.

In the connection portion 204, the wiring 65 and a conductive layer 251 are connected to each other, and the conductive layer 251 and a connector 242 are connected to each other. That is, in the connection portion 204, the conductive layer 225 is electrically connected to the FPC 72 through the conductive layer 251 and the connector 242. By employing this configuration, signals and power can be supplied from the FPC 72 to the wiring 65.

The wiring 65 can be formed using the same material and the same process as those used for the conductors 224 and 225 of the transistor 201 and the conductive layer 222 of the transistor 206. The conductive layer 251 can be formed using the same material and the same process as those used for the pixel electrode 111 included in the liquid crystal element 40. Forming the conductive layers included in the connection portion 204 in such a manner, i.e., using the same materials and the same processes as those used for the conductive layers used in the pixel 900 and the driver circuit portion 64, is preferable because an increase in the number of steps can be prevented.

The transistors 201 and 206 may have the same structure or different structures. That is, the transistor included in the driver circuit portion 64 and the transistor included in the pixel 900 may have the same structure or different structures. For example, the transistor included in the driver circuit portion 64 is not necessarily a channel-protective transistor, and may be a channel-etched transistor. In addition, the driver circuit portion 64 may have a plurality of transistors with different structures, and the pixel 900 may have a plurality of transistors with different structures. For example, the driver circuit portion 64 may have a channel-protective transistor and a channel-etched transistor. In addition, the pixel 900 may have a channel-protective transistor and a channel-etched transistor.

The semiconductor layer 231 of the transistor 201 and the semiconductor layer 231 of the transistor 206 may be formed using different materials. For example, amorphous silicon, low-temperature polycrystalline silicon, or the like may be used for the semiconductor layer 231 of the transistor 201, and an oxide semiconductor may be used for the semiconductor layer 231 of the transistor 206. When amorphous silicon, low-temperature polycrystalline silicon, or the like is used for the semiconductor layers of some transistors, the on-state current of the transistors can be increased. Consequently, a circuit capable of high-speed operation can be obtained. Furthermore, the area occupied by a circuit portion can be reduced. The use of the transistor having a high on-state current can reduce signal delay in wirings and can suppress display unevenness even in a display panel or a display device in which the number of wirings is increased because of an increase in size or resolution. Moreover, with such a structure, a highly reliable transistor can be formed.

Figure 7:
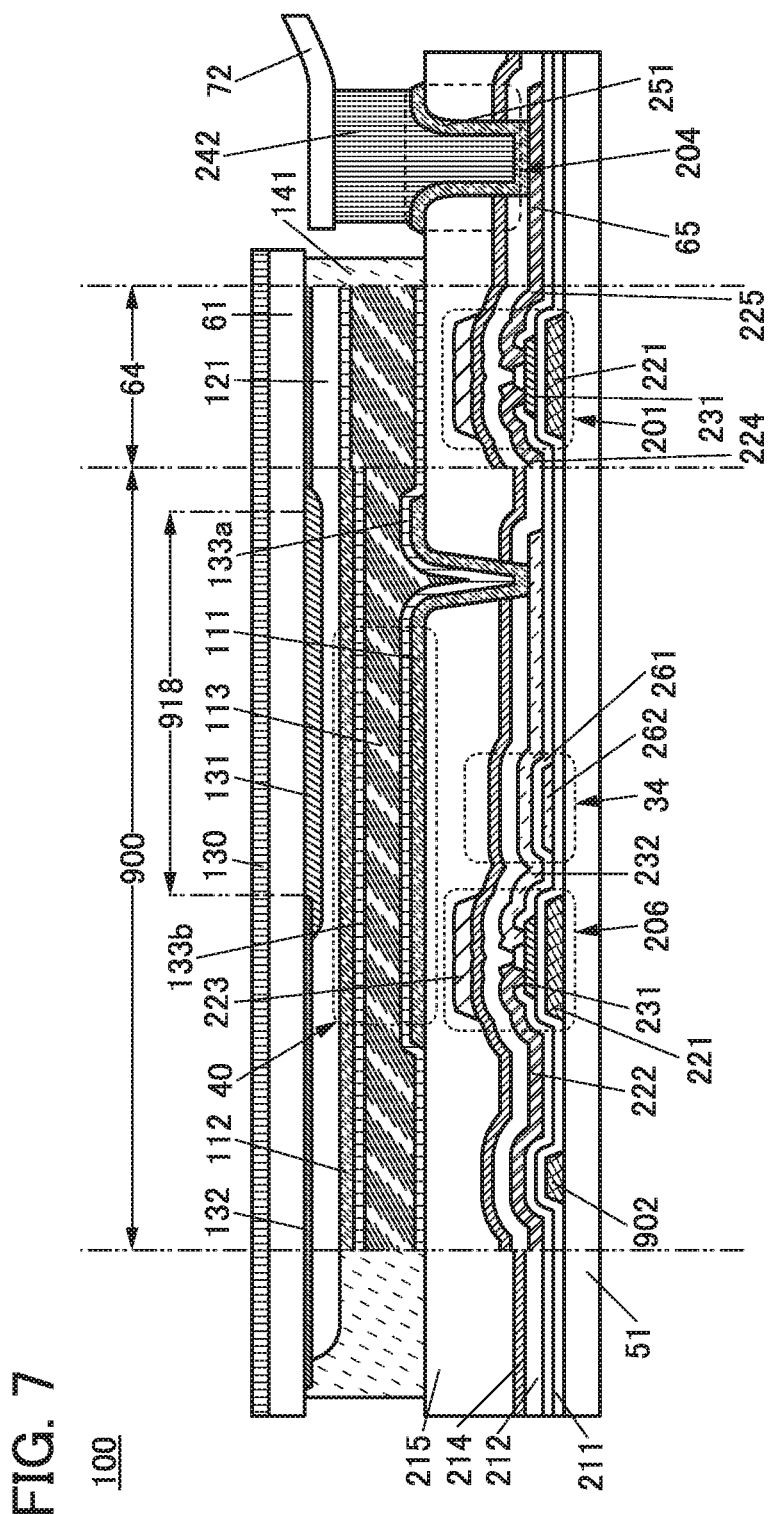
FIG. 7 is a cross-sectional view illustrating an example of a display device.

FIG. 7 illustrates a modification example of the display device 100. The structure of the display device 100 illustrated in FIG. 7 is different from that of the display device 100 illustrated in FIG. 6 in that the transistor 206 and the transistor 201 each have a gate electrode 223.

The gate electrode 223 is provided in contact with the insulating layer 214. The gate electrode 223 is provided to include a region which overlaps with the semiconductor layer 231. A metal material such as copper can be used for the gate electrode 223, for example. Specifically, the same material as that of the gate electrode 221 can be used, for example. Note that the gate electrode 223 may be formed using a material different from that of the gate electrode 221. For example, one of the gate electrodes 221 and 223 may be formed using a material having a light-blocking property, such as a metal material. Alternatively, one of the gate electrodes 221 and 223 may be formed using an oxide conductor.

The gate electrode 221 and the gate electrode 223 can be electrically connected to each other. Transistors having such a structure in which two gate electrodes are electrically connected to each other can have a higher field-effect mobility and thus have higher on-state current than other transistors. Consequently, a circuit capable of high-speed operation can be obtained. Furthermore, the area occupied by a circuit portion can be reduced. The use of the transistor having a high on-state current can reduce signal delay in wirings and can suppress display unevenness even in a display panel or a display device in which the number of wirings is increased because of an increase in size or resolution. Moreover, with such a structure, a highly reliable transistor can be formed.

Note that some of the transistors included in the display device 100 each may have the gate electrode 223 and the other thereof each may have no gate electrode 223. For example, the transistor 201 may have the gate electrode 223, and the transistor 206 may have no gate electrode 223.

Alternatively, for example, the transistor 206 may have the gate electrode 223, and the transistor 201 may have no gate electrode 223. Further alternatively, some or all of the transistors included in the display device 100 may each have no gate electrode 221.

Next, the details of the materials that can be used for components of the display device of one embodiment of the present invention and the like are described. Note that description on the components already described is omitted in some cases. The materials described below can be used as appropriate in the display device, the touch panel, and the components thereof described later.

<<Substrates 51 and 61>>

There are no large limitations on the material of the substrate used in the display device of one embodiment of the present invention; a variety of substrates can be used. For example, a glass substrate, a quartz substrate, a sapphire substrate, a semiconductor substrate, a ceramic substrate, a metal substrate, or a plastic substrate can be used.

The weight and thickness of the display device can be reduced by using a thin substrate. Furthermore, a flexible display device can be obtained by using a substrate that is thin enough to have flexibility.

The display device of one embodiment of the present invention is fabricated by forming a transistor and the like over the fabrication substrate, then transferring the transistor and the like on another substrate. The use of the fabrication substrate enables the following: a formation of a transistor with favorable characteristics; a formation of a transistor with low power consumption; a manufacturing of a durable display device; an addition of heat resistance to the display device; a manufacturing of a more lightweight display device; or a manufacturing of a thinner display device. Examples of a substrate to which a transistor is transferred include, in addition to the substrate over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, a rubber substrate, and the like.

<<Semiconductor layer>>

A semiconductor material used for the semiconductor layer is not particularly limited, and for example, an oxide semiconductor, silicon, or germanium can be used. There is no particular limitation on the crystallinity of a semiconductor material used for the semiconductor layer, and an amorphous semiconductor or a semiconductor having crystallinity (a microcrystalline semiconductor, a polycrystalline semiconductor, a single-crystal semiconductor, or a semiconductor partly including crystal regions) may be used. The use of a semiconductor having crystallinity is preferable as the degradation of a transistor's characteristics can be reduced.

For example, a Group 14 element, a compound semiconductor, or an oxide semiconductor can be used for the semiconductor layer. Typically, a semiconductor including silicon, a semiconductor including gallium arsenide, or an oxide semiconductor including indium can be used for the semiconductor layer.

An oxide semiconductor is preferably used for the semiconductor in which the channel of a transistor is formed. In particular, using an oxide semiconductor with a larger bandgap than that of silicon is preferable. The use of a semiconductor material with a larger bandgap than that of silicon and a small carrier density is preferable because the current during the off state of the transistor can be reduced.

The above description, the description in Embodiment 4 and the like can be referred to for the oxide semiconductor.

The use of such an oxide semiconductor for the semiconductor layer makes it possible to provide a highly reliable transistor in which a change in the electrical characteristics is reduced.

Charge accumulated in a capacitor through the transistor can be retained for a long time because of low off-state current of the transistor. The use of such a transistor in pixels allows a driver circuit to stop while the gray level of a displayed image is maintained. As a result, a display device with extremely low power consumption is obtained.

The transistors 201 and 206 preferably include an oxide semiconductor that is highly purified to reduce the formation of oxygen vacancies. This makes the current during the off-state (off-state current) of the transistor low. Accordingly, an electrical signal such as an image signal can be held for a long period, and a writing interval can be set long in an on state. Thus, the frequency of refresh operation can be reduced, which leads to an effect of reducing power consumption.

In the transistors 201 and 206, a relatively high field-effect mobility can be obtained, whereby high-speed operation is possible. The use of such transistors that are capable of high-speed operation in the display device enables the formation of the transistor in the display portion and the transistors in the driver circuit portion over the same substrate. This means that a semiconductor device separately formed with a silicon wafer or the like does not need to be used as the driver circuit, which enables a reduction in the number of components in the display device. In addition, using the transistor that can operate at high speed in the display portion also can enable the provision of a high-quality image.

<<Insulating Layer>>

An organic insulating material or an inorganic insulating material can be used as an insulating material that can be used for the insulating layer, the overcoat, the spacer, or the like included in the display device. Examples of an organic insulating material include an acrylic resin, an epoxy resin, a polyimide resin, a polyamide resin, a polyimide-amide resin, a siloxane resin, a benzocyclobutene-based resin, and a phenol resin. Examples of an inorganic insulating film include a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

<<Conductive Layer>>

For the conductive layer such as the gate, the source, and the drain of a transistor and the wiring, the electrode, and the like of the display device, a single-layer structure or a layered structure using any of metals such as aluminum, titanium, chromium, nickel, copper, yttrium, zirconium, molybdenum, silver, tantalum, and tungsten, or an alloy containing any of these metals as its main component can be used. For example, a two-layer structure in which a titanium film is stacked over an aluminum film; a two-layer structure in which a titanium film is stacked over a tungsten film; a two-layer structure in which a copper film is stacked over a molybdenum film; a two-layer structure in which a copper film is stacked over an alloy film containing molybdenum and tungsten; a two-layer structure in which a copper film is stacked over an alloy film containing copper, magnesium, and aluminum; a three-layer structure in which titanium film or a titanium nitride film, an aluminum film or a copper film, and a titanium film or a titanium nitride film are stacked in this order; a three-layer structure in which a molybdenum film or a molybdenum nitride film, an aluminum film or a copper film, and a molybdenum film or a molybdenum nitride film are stacked in this order; or the like can be employed. For example, in the case where the conductive layer has a three-layer structure, it is preferable that each of the first and third layers be a film formed of titanium, titanium nitride, molybdenum, tungsten, an alloy containing molybdenum and tungsten, an alloy containing molybdenum and zirconium, or molybdenum nitride, and that the second layer be a film formed of a low-resistance material such as copper, aluminum, gold, silver, or an alloy containing copper and manganese. Note that light-transmitting conductive materials such as ITO, indium oxide containing tungsten oxide, indium zinc oxide containing tungsten oxide, indium oxide containing titanium oxide, indium tin oxide containing titanium oxide, indium zinc oxide, or ITSO may be used.

An oxide conductor may be formed by controlling the resistivity of the oxide semiconductor.

<<Adhesive Layer 141>>

A curable resin such as a heat-curable resin, a photocurable resin, or a two-component type curable resin can be used for the adhesive layer 141. For example, an acrylic resin, a urethane resin, an epoxy resin, or a siloxane resin can be used.

<<Connector 242>>

As the connector 242, for example, an anisotropic conductive film (ACF) or an anisotropic conductive paste (ACP) can be used.

<<Coloring Layer 131>>

The coloring layer 131 is a colored layer that transmits light in a specific wavelength range. Examples of materials that can be used for the coloring layer 131 include a metal material, a resin material, and a resin material containing a pigment or dye.

<<Light-Blocking Layer 132>>

The light-blocking layer 132 is provided, for example, between adjacent coloring layers 131 for different colors. A black matrix formed with, for example, a metal material or a resin material containing a pigment or dye can be used as the light-blocking layer 132. Note that it is preferable to provide the light-blocking layer 132 also in a region other than the pixel 900, such as the driver circuit portion 64, in which case leakage of guided light or the like can be inhibited.

<3. Example of Fabricating Method of Display Device>

An example of a method for manufacturing the display device 100 illustrated in FIG. 6 is described with reference to FIGS. 8A to 8C and FIGS. 9A and 9B. Note that in this example of the manufacturing method, a different display device or the like of this embodiment can be manufactured by modifying the structures of transistors, a liquid crystal element, and the like which are formed.

The thin films constituting the display device (i.e., the insulating film, the semiconductor film, the conductive film, and the like) can be formed by any of a sputtering method, a chemical vapor deposition (CVD) method, a vacuum evaporation method, a pulsed laser deposition (PLD) method, an atomic layer deposition (ALD) method, and the like. As examples of the CVD method, a plasma-enhanced CVD (PECVD) method or a thermal CVD method can be given. As an example of the thermal CVD method, a metal organic CVD (MOCVD) method can be given.

Alternatively, the thin films constituting the display device (i.e., the insulating film, the semiconductor film, the conductive film, and the like) can be formed by a method such as spin coating, dipping, spray coating, inkjet printing, dispensing, screen printing, or offset printing, or with a doctor knife, a slit coater, a roll coater, a curtain coater, or a knife coater.

The thin films constituting the display device can be processed using a lithography method or the like. Alternatively, island-shaped thin films may be formed by a film formation method using a blocking mask. Alternatively, the thin films may be processed by a nano-imprinting method, a sandblasting method, a lift-off method, or the like.

In the case of processing by a photolithography method, light with an i-line (with a wavelength of 365 nm), light with a g-line (with a wavelength of 436 nm), light with an h-line (with a wavelength of 405 nm), and light in which the i-line, the g-line, and the h-line are mixed can be used. Alternatively, ultraviolet light, KrF laser light, ArF laser light, or the like can be used. Exposure may be performed by liquid immersion exposure technique. As light used in exposure, extreme ultra-violet light (EUV), X-rays, or the like can be given. An electron beam can be used instead of a light used in exposure. It is preferable to use extreme ultra-violet light, X-rays, or an electron beam because extremely minute processing can be performed. Note that when exposure is performed by scanning of a beam such as an electron beam, a photomask is not needed.

For etching of the thin film, dry etching, wet etching, a sandblast method, or the like can be used.

To manufacture the display device 100, first, a conductive layer is formed over the substrate 51 and processed by a lithography method or the like, whereby the wiring 902 and the gate electrode 221 are formed. As described above, the wiring 902 functions as the scan line. In addition, the gate electrode 221 can serve as part of the scan line. It is preferable to form the wiring 902 and the gate electrode 221 with the use of a conductive material which has low resistivity and blocks visible light, e.g., a metal material such as copper.

Next, the insulating layer 211 is formed. As described above, the insulating layer 211 functions as the gate insulating layers of the transistors provided in the display device 100.

After that, a semiconductor layer is formed and processed by a lithography method or the like to form the semiconductor layer 231 and a semiconductor layer 262a (FIG. 8A). The semiconductor layer 231 includes regions which function as the channel regions of the transistors provided in the display device 100. An oxide semiconductor is preferably used for the semiconductor layer 231 and the semiconductor layer 262a. For example, each of the semiconductor layer 231 and the semiconductor layer 262a preferably includes indium and is further preferably an In-M-Zn oxide (M is Al, Ti, Ga, Ge, Y, Zr, La, Ce, Nd, Sn, or Hf) film.

Next, the insulating layer 261 is formed (FIG. 8B). As described above, the insulating layer 261 functions as the channel protective layers of the transistors provided in the display device 100 and as the dielectric layer of the capacitor provided in the display device 100.

The insulating layer 261 can be a silicon oxynitride film, for example. The insulating layer 261 can be formed by, for example, a CVD method, specifically, a PECVD method. When a film including silicon oxynitride is formed by a CVD method, for example, a silane gas is used as a deposition gas and a nitrogen oxide gas such as a nitrous oxide gas is used. In that case, hydrogen or the like is supplied to the semiconductor layer 262a during formation of the insulating layer 261, so that the resistance of the semiconductor layer 262a can be reduced. Thus, the conductive layer 262 that functions as the first electrode of the capacitor provided in the display device 100 can be formed.

Note that the insulating layer 261 formed by the above method includes ammonia. Even when the hydrogen or the like supplied to the conductive layer 262 is diffused to the outside by heat treatment performed after the formation of the insulating layer 261, an increase in the resistivity of the conductive layer 262 can be prevented because ammonia included in the insulating layer 261 is supplied to the conductive layer 262.

Hydrogen or the like is supplied to the semiconductor layer 231 during the formation of the insulating layer 261, so that the resistance of the channel region included in the semiconductor layer 231 might be reduced. However, the resistance of the channel region included in the semiconductor layer 231 can be increased in a later step; therefore, the reduction in the resistance at the time of the formation of the insulating layer 261 does not cause a problem.

Next, an opening reaching the semiconductor layer 231 is provided in the insulating layer 261, and then a semiconductor layer 232a is formed. Note that the semiconductor layer 232a includes a region which overlaps with the conductive layer 262. In addition, the semiconductor layer 232a is electrically connected to the semiconductor layer 231 via the opening portion provided in the insulating layer 261.

An In—Zn oxide is preferably used for the semiconductor layer 232a, for example. The In—Zn oxide is preferably formed by, for example, a sputtering method in an argon (argon 100%) atmosphere at a substrate temperature that is set to a temperature which is not increased by intentional heating. When an In—Zn oxide is used for the semiconductor layer 232a, the conductive layer 232 can be formed by a reduction in the resistance of the semiconductor layer 232a in a later step, and the resistance of the formed conductive layer 232 can be prevented from being increased in a step after the step. Note that an oxide semiconductor other than an In—Zn oxide may be used for the semiconductor layer 232a. In that case, the semiconductor layer 232a preferably includes one or more of the metal elements included in the semiconductor layer 231. In the case where the semiconductor layer 232a includes one or more of the metal elements included in the semiconductor layer 231, the same manufacturing apparatus (e.g., a deposition apparatus or a processing apparatus) can be used in two or more steps, so that the manufacturing costs can be reduced.

Next, opening portions reaching the semiconductor layer 231 are formed in the insulating layer 261, and then the conductive layer 222, the conductive layer 224, the conductive layer 225, and the wiring 65 are formed (FIG. 8C). Note that the conductive layer 222, the conductive layer 224, and the conductive layer 225 are electrically connected to the semiconductor layer 231 via the openings provided in the insulating layer 261.

As described above, the conductive layer 222 functions as one of the source and drain electrodes of the transistor 206. The conductive layer 224 functions as one of the source and drain electrodes of the transistor 201. The conductive layer 225 functions as the other of the source and drain electrodes of the transistor 201. The conductive layer 222 can serve as part of the signal line. The conductive layer 222, the conductive layer 224, the conductive layer 225, and the wiring 65 are preferably formed using a conductive material which has low resistance and blocks visible light, e.g., a metal material such as copper.

Since the insulating layer 261 functions as the channel protective layer, the channel region of the semiconductor layer 231 can be prevented from being damaged by etching at the time of formation of the conductive layer 222, the semiconductor layer 232a, the conductive layer 224, and the conductive layer 225. Accordingly, the electrical characteristics of the transistors included in the display device 100 can be stabilized, so that the transistors can have high reliability.

After the formation of the opening portions in the insulating layer 261, an inert gas such as argon may be supplied to the semiconductor layer 231, whereby contact portions with the source and drain electrodes of the transistor 206 and/or the transistor 201 may have n-type conductivity. A method for supplying an inert gas can be a sputtering method, an ion implantation method, an ion doping method, a plasma immersion ion implantation method, or plasma treatment, for example. Thus, the on-state current of the transistor 206 and/or the transistor 201 can be increased, and the operation speed of the display device 100 can be increased.

Next, the insulating layer 212 is formed. For the insulating layer 212, for example, a film including silicon oxynitride can be used. The insulating layer 212 can be formed by, for example, a CVD method, specifically, a PECVD method. When a film including silicon oxynitride is formed by a CVD method, for example, a silane gas is used as a deposition gas and a nitrogen oxide gas such as a nitrous oxide gas is used. In that case, hydrogen or the like is supplied to the semiconductor layer 232a during formation of the insulating layer 212, so that the resistance of the semiconductor layer 232a can be reduced. Thus, the conductive layer 232 which functions as the source or drain electrode of the transistor 206 and as the second electrode of the capacitor 34 can be formed.

The insulating layer 212 preferably contains oxygen at a higher proportion than the stoichiometric composition. For example, in the case where the insulating layer 212 is formed by a CVD method, oxygen, a mixed gas of oxygen and a nitrogen oxide gas such as nitrous oxide or nitrogen dioxide, or the like is used as a deposition gas, whereby oxygen can be contained in the insulating layer 212. Alternatively, oxygen may be introduced into the insulating layer 212 by an ion implantation method, an ion doping method, a plasma immersion ion implantation method, plasma treatment, or the like after the insulating layer 212 is formed.

Part of oxygen contained in the insulating layer 212 and the like passes through the insulating layer 261 and is supplied to the channel region of the semiconductor layer 231 by heat treatment or the like. Accordingly, in the case where the channel region of the semiconductor layer 231 is an oxide semiconductor, oxygen vacancies of the channel region can be reduced. Therefore, the resistance of the channel region of the semiconductor layer 231 can be increased, variation in the electrical characteristics of the transistor can be prevented, and the reliability can be improved.

For example, in the case where an oxide conductor is used for the conductive layer 262, oxygen contained in the insulating layer 212 and the like diffuses into the conductive layer 262, so that the resistance of the conductive layer 262 might be increased. However, the conductive layer 232 is formed using a material which is less likely to be permeable to oxygen. Accordingly, the oxygen contained in the insulating layer 212 does not easily supplied to the conductive layer 262. Therefore, even in the case where an oxide conductor is used for the conductive layer 262, the increase in the resistance of the conductive layer 262 can be inhibited.

Next, the insulating layer 214 is formed. After that, the insulating layer 215 is formed. After the insulating layer 215 is formed, planarization treatment is performed on the insulating layer 215 by a chemical mechanical polishing (CMP) method or the like (FIG. 9A).

Next, an opening portion reaching the conductive layer 232 and an opening portion reaching the wiring 65 are formed in the insulating layer 215, the insulating layer 214, and the insulating layer 212. Then, a conductive layer is provided and processed by a lithography method or the like, whereby the pixel electrode 111 and the conductive layer 251 are formed. The pixel electrode 111 and the conductive layer 251 are electrically connected to the conductive layer 232 and the wiring 65, respectively, via the opening portions provided in the insulating layer 215, the insulating layer 214, and the insulating layer 212. As described above, a material having a function of transmitting visible light is used for the pixel electrode 111.

Next, the alignment film 133a is formed to cover the pixel electrode 111 (FIG. 9B). After that, the light-blocking layer 132, the coloring layer 131, the overcoat 121, the common electrode 112, and the alignment film 133b are formed over the substrate 61 (FIG. 9C). As described above, a material having a function of transmitting visible light is used for the common electrode 112.

The liquid crystal layer 113 is sealed with the adhesive layer 141 between the substrate 51 illustrated in FIG. 9B and the substrate 61 illustrated in FIG. 9C. Then, the connector 242, the FPC 72, and the polarizing plate 130 are formed. Through the above steps, the display device 100 having the structure in FIG. 6 can be formed.

As described above, in the method for manufacturing the display device of one embodiment of the present invention, the semiconductor layer 231 of the transistor 206 and the conductive layer 262 of the capacitor 34 can be formed in the same process. In addition, the insulating layer 261 which serves as the insulating layer functioning as the channel protective layer of the transistor 206 and also serves as the insulating layer functioning as the dielectric layer of the capacitor 34 can be formed in one process. The conductive layer 232 which serves as the conductive layer functioning as the other of the source and drain electrodes of the transistor 206 and also serves as the conductive layer functioning as the second electrode of the capacitor 34 can be formed in one process. Accordingly, the manufacturing process of the display device 100 can be simplified, so that the manufacturing costs of the display device 100 can be reduced.

As described above, the conductive layer 262 and the conductive layer 232 each have a function of transmitting visible light. Thus, the aperture ratio of the pixel 900 of the display device 100 can be increased. The light extraction efficiency can be increased as the aperture ratio becomes higher, so that the power consumption of the display device 100 can be reduced. In addition, the resolution of an image displayed by the display device 100 can be increased.

<<4. Pixel Arrangement Example>

Figure 10A:
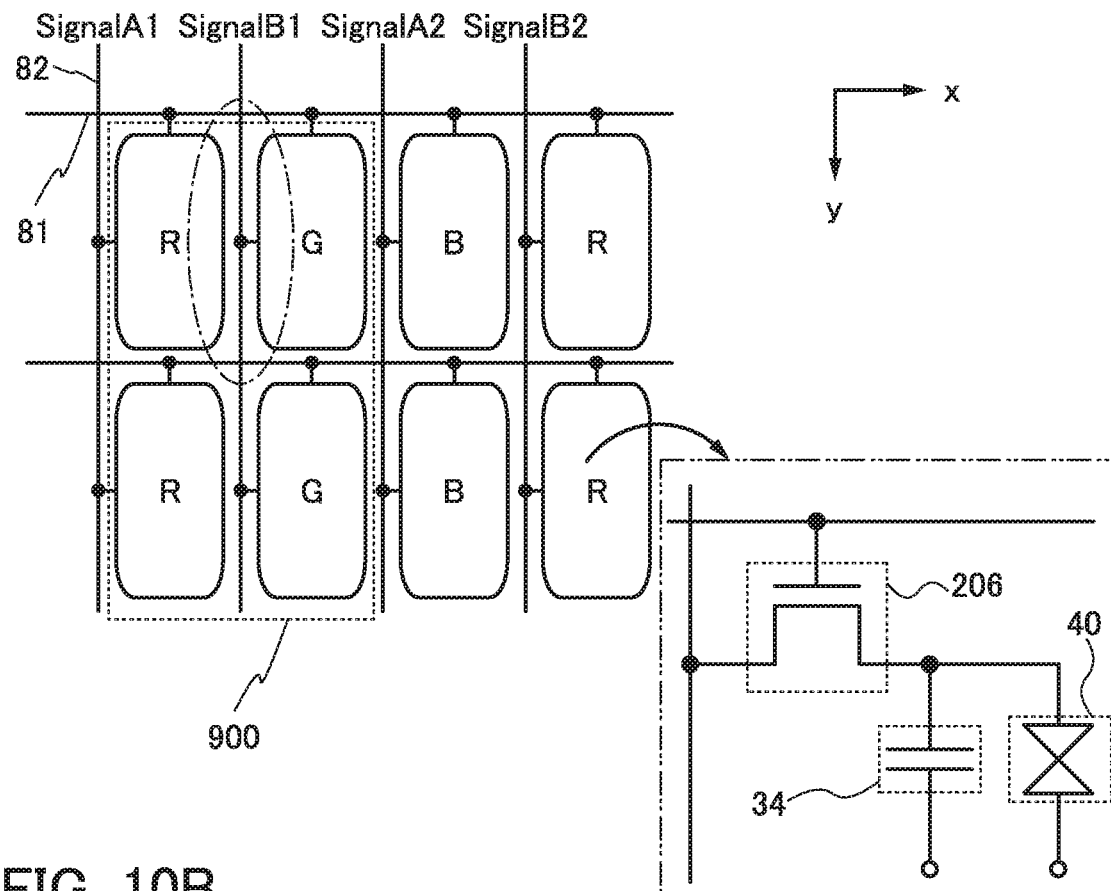
FIGS. 10A and 10B illustrate arrangement and configuration examples of pixels.
Figure 10B:
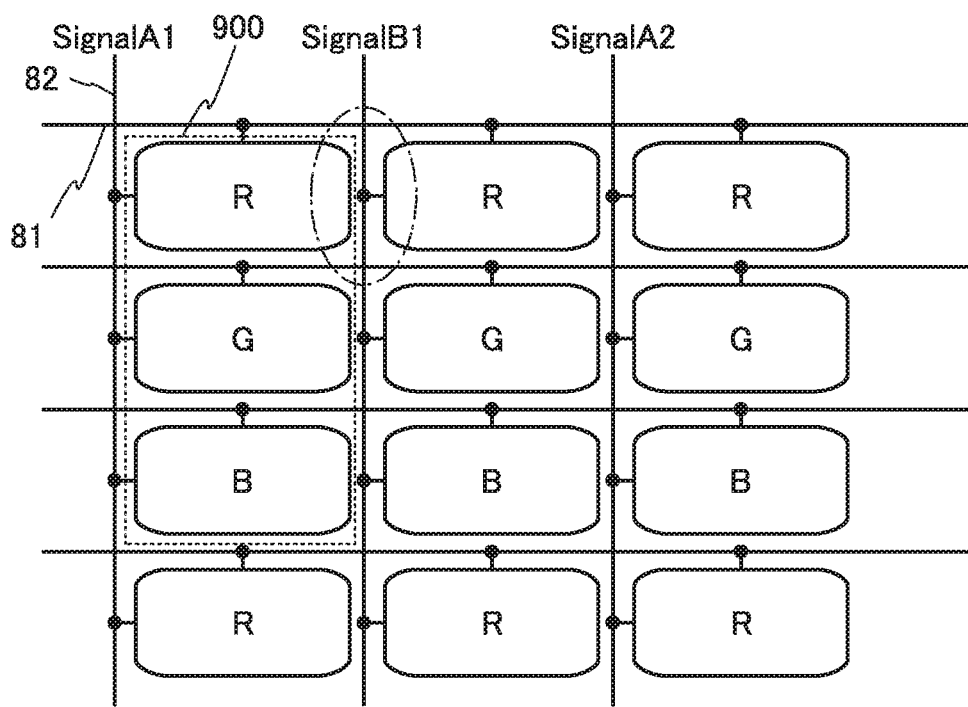

FIGS. 10A and 10B shows the pixel 900 and an example of an arrangement of sub-pixels included in the pixel 900. Each of FIGS. 10A and 10B illustrates an example in which a red subpixel R, a green subpixel G, and a blue subpixel B form one pixel. In FIGS. 10A and 10B, a plurality of scan lines 81 extend in an x direction, and a plurality of signal lines 82 extend in a y direction. The scan lines 81 and the signal lines 82 intersect with each other.

As shown by the dashed two dotted line in FIG. 10A, a subpixel includes the transistor 206, the capacitor 34, and the liquid crystal element 40. The gate electrode of the transistor 206 is electrically connected to the scan line 81. One of the source electrode and the drain electrode of the transistor 206 is electrically connected to the signal line 82, and the other thereof is electrically connected to the second electrode of the capacitor 34 and a first electrode of the liquid crystal element 40. The first electrode of the capacitor 34 and the first electrode of the liquid crystal element 40 are each supplied with a constant potential.

FIGS. 10A and 10B show examples where the source-line inversion driving is adopted. Signals A1 and A2 are signals with the same polarity. Signals B1 and B2 are signals with the same polarity. Signals A1 and B1 are signals with different polarities. Signals A2 and B2 are signals with different polarities.

As the definition of the display device become higher, the distance between the subpixels become shorter. Thus, as shown in the frame outlined in a dashed-dotted line in FIG. 10A, in the subpixel where the signal A1 is input, the liquid crystal is easily affected by potentials in both the signal A1 and the signal B1, in the vicinities of the signal line 82 where the signal B1 is input. This can make the liquid crystal more prone to alignment defects.

In FIG. 10A, the direction in which a plurality of subpixels exhibiting the same color are aligned is the y direction, and is substantially parallel to the direction that the signal lines 82 extend in. As shown in the frame outlined by a dashed-dotted line in FIG. 10A, subpixels exhibiting different colors are adjacent to each other, with the longer sides of the subpixels facing each other.

In FIG. 10B, the direction in which the plurality of subpixels exhibiting the same color are aligned is the x direction, and intersects with the direction that the signal lines 82 extend in. As shown in the frame outlined in a dashed-dotted line in FIG. 10B, subpixels exhibiting the same color are adjacent to each other, with the shorter sides of the subpixels facing each other.

When the side of the subpixel that is substantially parallel to the direction in which the signal lines 82 extend is the shorter sides of the subpixel as illustrated in FIG. 10B, the region where the liquid crystal is more prone to alignment defects can be made narrower, compared with the case (illustrated in FIG. 10A) where the side of the subpixel that is substantially parallel to the direction in which the signal lines 82 extend is the longer sides of the subpixel. When the region where the liquid crystal is more prone to alignment defects is positioned between subpixels exhibiting the same color as illustrated in FIG. 10B, display defects are less easily recognized by a user of the display device when compared with the case (see FIG. 10A) where the region is positioned between subpixels exhibiting different colors. In one embodiment of the present invention, a direction in which the subpixels exhibiting the same color are arranged preferably intersects with the direction in which the signal line 82 extends.

<5. Structure Example 3 of Display Device>

One embodiment of the present invention can be applied to a display device in which a touch sensor is implemented; such a display device is also referred to as an input/output device or a touch panel. Any of the structures of the display device described above can be applied to the touch panel. In this embodiment, the description focuses on an example in which the touch sensor is implemented in the display device 100.

There is no limitation on the sensing element (also referred to as a sensor element) included in the touch panel of one embodiment of the present invention. A variety of sensors capable of sensing an approach or a contact of an object such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element is described as an example.

Examples of the capacitive touch sensor element include a surface capacitive touch sensor element and a projected capacitive touch sensor element. Examples of the projected capacitive sensor element include a self-capacitive sensor element and a mutual capacitive sensor element. The use of a mutual capacitive sensor element is preferable because multiple points can be sensed simultaneously.

The touch panel of one embodiment of the present invention can have any of a variety of structures, including a structure in which a display device and a sensor element that are separately formed are attached to each other and a structure in which an electrode and the like included in a sensor element are provided on one or both of a substrate supporting a display element and a counter substrate.

Figure 11A:
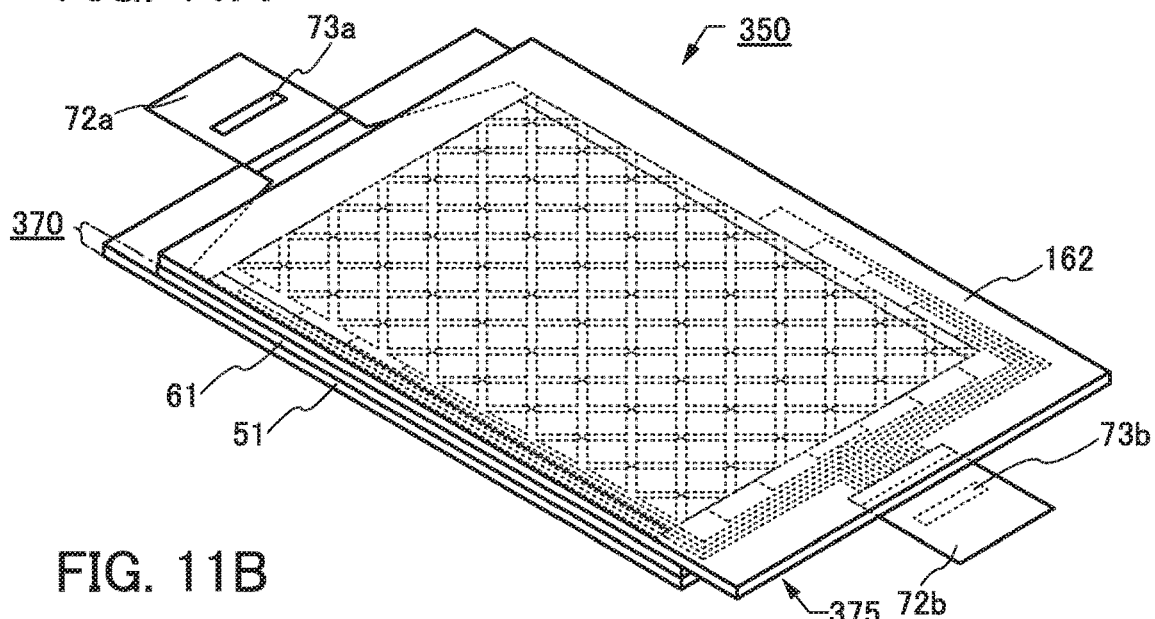
FIGS. 11A and 11B are perspective views illustrating an example of a display device.
Figure 11B:
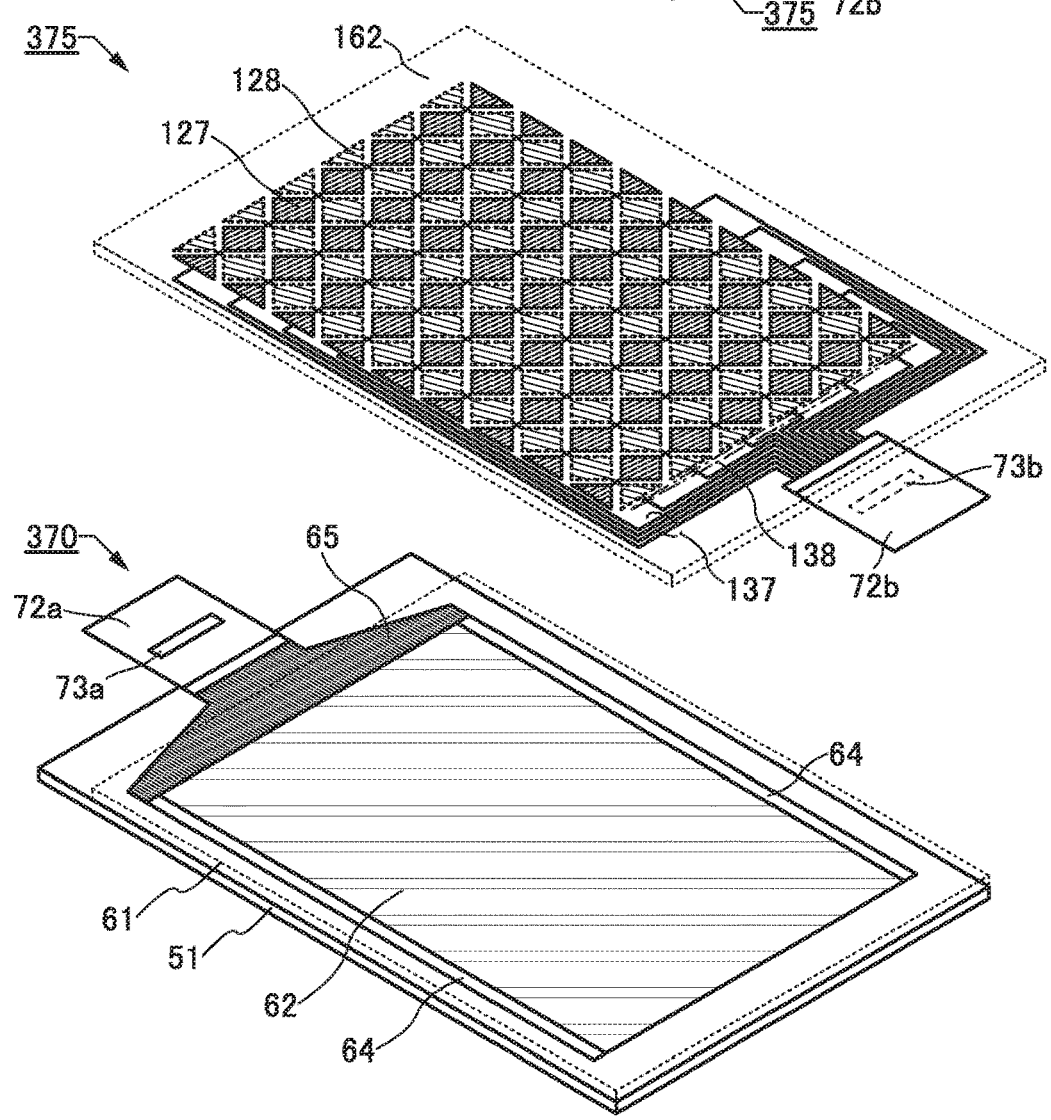
Figure 12:
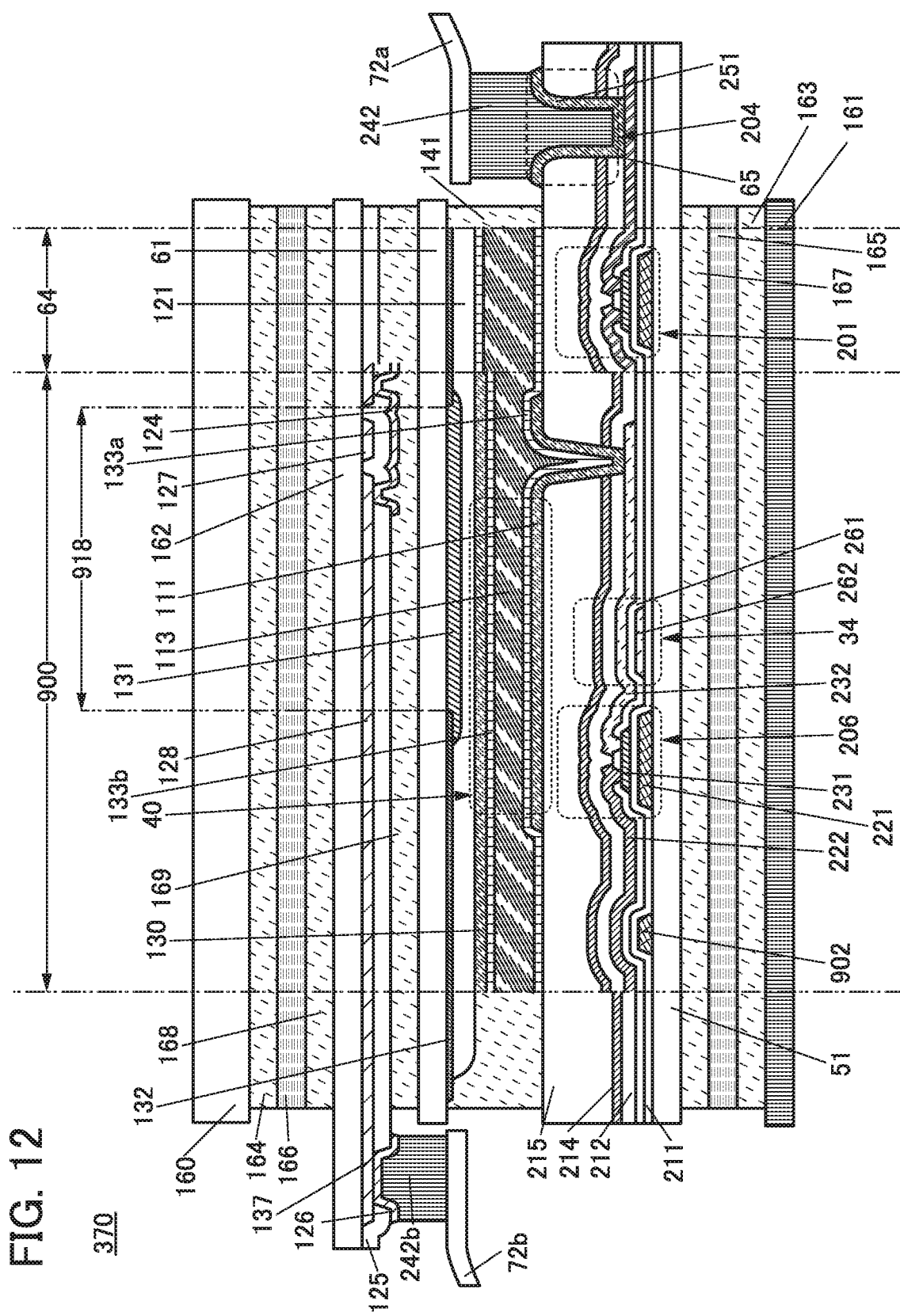
FIG. 12 is a cross-sectional view illustrating an example of a display device.

FIGS. 11A and 11B and FIG. 12 each illustrate an example of the touch panel. FIG. 11A is a perspective view of a touch panel 350. FIG. 11B is a developed view of the schematic perspective view of FIG. 11A. Note that for simplicity, FIGS. 11A and 11B illustrate only the major components. In FIG. 11B, the outlines of the substrate 61 and a substrate 162 are illustrated only in dashed lines. FIG. 12 is a cross-sectional view of the touch panel 350.

The touch panel 350 has a structure in which a display device and a sensor element that are fabricated separately are bonded together.

The touch panel 350 includes an input device 375 and a display device 370 that are provided to overlap with each other.

The input device 375 includes the substrate 162, an electrode 127, an electrode 128, a plurality of wirings 137, and a plurality of wirings 138. An FPC 72b is electrically connected to each of the plurality of wirings 137 and the plurality of wirings 138. An IC 73b includes the FPC 72b.

The display device 370 includes the substrate 51 and the substrate 61 which are provided to face each other. The display device 370 includes the display portion 62 and the driver circuit portion 64. The wiring 65 and the like are provided over the substrate 51. An FPC 72a is electrically connected with the wiring 65. An IC 73a is provided on the FPC 72a.

The wiring 65 supplies signals and power to the display portion 62 and the driver circuit portion 64. The signals and power are input to the wiring 65 from the outside or the IC 73a, through the FPC 72a.

FIG. 12 is a cross-sectional view of the pixel 900, the driver circuit portion 64, a region that includes the FPC 72a, a region that includes the FPC 72b, and the like.

The substrates 51 and 61 are bonded to each other by the adhesive layer 141. The substrates 61 and 162 are bonded to each other by an adhesive layer 169. Here, the layers from the substrate 51 to the substrate 61 correspond to the display device 370. The layers from the substrate 162 to an electrode 124 correspond to the input device 375. That is, the adhesive layer 169 bonds the display device 370 and the input device 375 together.

The structure of the display device 370 illustrated in FIG. 12 is a structure similar to the display device 100 illustrated in FIG. 6; detailed description is omitted here.

A polarizing plate 165 is bonded to the substrate 51 with an adhesive layer 167. A backlight 161 is bonded to the polarizing plate 165 with an adhesive layer 163.

Examples of a type of backlight that can be used as the backlight 161 include a direct-below backlight, an edge-light backlight and the like. The use of the direct-below backlight with light-emitting diodes (LEDs) is preferable as it enables complex local dimming and increase in contrast. The edge-light type backlight is preferably used because the thickness of a module including the backlight can be reduced. Moreover, quantum dots may be used for the backlight 161.

A quantum dot is a semiconductor nanocrystal with a size of several nanometers and contains approximately $1 \times 10^3$ to $1 \times 10^6$ atoms. Since energy shift of quantum dots depends on their size, quantum dots made of the same substance emit light with different wavelengths depending on their size; thus, emission wavelengths can be easily adjusted by changing the size of quantum dots.

Since a quantum dot has an emission spectrum with a narrow peak, emission with high color purity can be obtained. In addition, a quantum dot is said to have a theoretical external quantum efficiency of approximately 100%, which far exceeds that of a fluorescent organic compound, i.e., 25%, and is comparable to that of a phosphorescent organic compound. Therefore, a quantum dot can be used as a light-emitting material to obtain a light-emitting element having high light-emitting efficiency. Furthermore, since a quantum dot which is an inorganic compound has high inherent stability, a light-emitting element which is favorable also in terms of lifetime can be obtained.

Examples of a material of a quantum dot include a Group 14 element in the periodic table, a Group 15 element in the periodic table, a Group 16 element in the periodic table, a compound of a plurality of Group 14 elements in the periodic table, a compound of an element belonging to any of Groups 4 to 14 in the periodic table and a Group 16 element in the periodic table, a compound of a Group 2 element in the periodic table and a Group 16 element in the periodic table, a compound of a Group 13 element in the periodic table and a Group 15 element in the periodic table, a compound of a Group 13 element in the periodic table and a Group 17 element in the periodic table, a compound of a Group 14 element in the periodic table and a Group 15 element in the periodic table, a compound of a Group 11 element in the periodic table and a Group 17 element in the periodic table, iron oxides, titanium oxides, spinel chalcogenides, and semiconductor clusters.

Specific examples include, but are not limited to, cadmium selenide; cadmium sulfide; cadmium telluride; zinc selenide; zinc oxide; zinc sulfide; zinc telluride; mercury sulfide; mercury selenide; mercury telluride; indium arsenide; indium phosphide; gallium arsenide; gallium phosphide; indium nitride; gallium nitride; indium antimonide; gallium antimonide; aluminum phosphide; aluminum arsenide; aluminum antimonide; lead selenide; lead telluride; lead sulfide; indium selenide; indium telluride; indium sulfide; gallium selenide; arsenic sulfide; arsenic selenide; arsenic telluride; antimony sulfide; antimony selenide; antimony telluride; bismuth sulfide; bismuth selenide; bismuth telluride; silicon; silicon carbide; germanium; tin; selenium;

tellurium; boron; carbon; phosphorus; boron nitride; boron phosphide; boron arsenide; aluminum nitride; aluminum sulfide; barium sulfide; barium selenide; barium telluride; calcium sulfide; calcium selenide; calcium telluride; beryllium sulfide; beryllium selenide; beryllium telluride; magnesium sulfide; magnesium selenide; germanium sulfide; germanium selenide; germanium telluride; tin sulfide; tin selenide; tin telluride; lead oxide; copper fluoride; copper chloride; copper bromide; copper iodide; copper oxide; copper selenide; nickel oxide; cobalt oxide; cobalt sulfide; triiron tetraoxide; iron sulfide; manganese oxide; molybdenum sulfide; vanadium oxide; tungsten oxide; tantalum oxide; titanium oxide; zirconium oxide; silicon nitride; germanium nitride; aluminum oxide; barium titanate; a compound of selenium, zinc, and cadmium; a compound of indium, arsenic, and phosphorus; a compound of cadmium, selenium, and sulfur; a compound of cadmium, selenium, and tellurium; a compound of indium, gallium, and arsenic; a compound of indium, gallium, and selenium; a compound of indium, selenium, and sulfur; a compound of copper, indium, and sulfur; and combinations thereof. What is called an alloyed quantum dot, whose composition is represented by a given ratio, may be used. For example, an alloyed quantum dot of cadmium, selenium, and sulfur is a means effective in obtaining blue light because the emission wavelength can be changed by changing the content ratio of elements.

As the quantum dot, any of a core-type quantum dot, a core-shell quantum dot, a core-multishell quantum dot, and the like can be used. Note that when a core is covered with a shell formed of another inorganic material having a wider band gap, the influence of defects and dangling bonds existing at the surface of a nanocrystal can be reduced. Since such a structure can significantly improve the quantum efficiency of light emission, it is preferable to use a core-shell or core-multishell quantum dot. Examples of the material of a shell include zinc sulfide and zinc oxide.

Quantum dots have a high proportion of surface atoms and thus have high reactivity and easily cohere together. For this reason, it is preferable that a protective agent be attached to, or a protective group be provided at the surfaces of quantum dots. The attachment of the protective agent or the provision of the protective group can prevent cohesion and increase solubility in a solvent. It can also reduce reactivity and improve electrical stability. Examples of the protective agent (or the protective group) include polyoxyethylene alkyl ethers such as polyoxyethylene lauryl ether, polyoxyethylene stearyl ether, and polyoxyethylene oleyl ether; trialkylphosphines such as tripropylphosphine, tributylphosphine, trihexylphosphine, and trioctylphoshine; polyoxyethylene alkylphenyl ethers such as polyoxyethylene n-octylphenyl ether and polyoxyethylene n-nonylphenyl ether; tertiary amines such as tri(n-hexyl)amine, tri(n-octyl)amine, and tri(n-decyl)amine; organophosphorus compounds such as tripropylphosphine oxide, tributylphosphine oxide, trihexylphosphine oxide, trioctylphosphine oxide, and tridecylphosphine oxide; polyethylene glycol diesters such as polyethylene glycol dilaurate and polyethylene glycol distearate; organic nitrogen compounds such as nitrogen-containing aromatic compounds, e.g., pyridines, lutidines, collidines, and quinolines; aminoalkanes such as hexylamine, octylamine, decylamine, dodecylamine, tetradecylamine, hexadecylamine, and octadecylamine; dialkylsulfides such as dibutylsulfide; dialkylsulfoxides such as dimethylsulfoxide and dibutylsulfoxide; organic sulfur compounds such as sulfur-containing aromatic compounds, e.g., thiophenes; higher fatty acids such as a palmitin acid, a stearic acid, and an oleic acid; alcohols; sorbitan fatty acid esters; fatty acid modified polyesters; tertiary amine modified polyurethanes; and polyethyleneimines.

Since band gaps of quantum dots are increased as their size is decreased, the size is adjusted as appropriate so that light with a desired wavelength can be obtained. Light emission from the quantum dots is shifted to a blue color side, i.e., a high energy side, as the crystal size is decreased; thus, emission wavelengths of the quantum dots can be adjusted over wavelength regions of spectra of an ultraviolet region, a visible light region, and an infrared region by changing the size of quantum dots. The range of size (diameter) of quantum dots which is usually used is 0.5 nm to 20 nm, preferably 1 nm to 10 nm. The emission spectra are narrowed as the size distribution of the quantum dots gets smaller, and thus light can be obtained with high color purity. The shape of the quantum dots is not particularly limited and may be a spherical shape, a rod shape, a circular shape, or the like. Quantum rods which are rod-like shape quantum dots emit directional light polarized in the c-axis direction; thus, quantum rods can be used as a light-emitting material to obtain a light-emitting element with higher external quantum efficiency.

A polarizing plate 166 is bonded to the substrate 162 by an adhesive layer 168. A protection substrate 160 is bonded to the polarizing plate 166 by an adhesive layer 164. The protection substrate 160 may be used as the substrate that objects such as a finger or a stylus directly contact, when the touch panel 350 is incorporated into an electronic device. A substrate that can be used as the substrates 51 and 61 or the like can be used as the protection substrate 160. A structure where a protective layer is formed on the surface of the substrate that can be used as the substrates 51 and 61 or the like is preferably used for the protection substrate 160. Alternatively, a reinforced glass or the like is preferably used as the protection substrate 160. The protective layer can be formed with a ceramic coating. The protective layer can be formed using an inorganic insulating material such as silicon oxide, aluminum oxide, yttrium oxide, or yttria-stabilized zirconia (YSZ).

The polarizing plate 166 may be provided between the input device 375 and the display device 370. In that case, the protection substrate 160, the adhesive layer 164, and the adhesive layer 168 that are illustrated in FIG. 12 are not necessarily provided. In other words, the substrate 162 can be positioned on the outermost surface of the touch panel 350. The above-described material that can be used for the protection substrate 160 is preferably used for the substrate 162.

The electrodes 127 and 128 are provided over the substrate 162, on the substrate 61 side. The electrodes 127 and 128 are formed on the same plane. An insulating layer 125 is provided to cover the electrodes 127 and 128. The electrode 124 is electrically connected to two of the electrodes 128 that are provided on both sides of the electrode 127, through an opening provided in the insulating layer 125.

In the conductive layers included in the input device 375, the conductive layers (e.g., the electrodes 127 and 128) that overlap with the display region 918 are formed using a visible-light-transmitting material.

The wiring 137 that is obtained by processing the same conductive layer as the electrodes 127 and 128 is connected to a conductive layer 126 that is obtained by processing the same conductive layer as the electrode 124. The conductive layer 126 is electrically connected to the FPC 72*b* through a connector 242*b*.

This embodiment can be combined with any of other embodiments as appropriate. In the case where a plurality of structure examples are described in one embodiment in this specification, some of the structure examples can be combined as appropriate.

Embodiment 2

In this embodiment, operation modes which can be executed in the display device of one embodiment of the present invention are described with reference to FIGS. 13A to 13C.

A normal driving mode (Normal mode) with a normal frame frequency (typically, higher than or equal to 60 Hz and lower than or equal to 240 Hz) and an idling stop (IDS) driving mode with a low frame frequency will be described below.

Note that the IDS driving mode refers to a driving method in which after image data is written, rewriting of image data is stopped. This increases the interval between writing of image data and subsequent writing of image data, thereby reducing the power that would be consumed by writing of image data in that interval. The IDS driving mode can be performed at a frame frequency which is 1/100 to 1/10 of the normal driving mode, for example. A still image is displayed by the same video signals in consecutive frames. Thus, the IDS driving mode is particularly effective when displaying a still image. When an image is displayed using IDS driving, power consumption is reduced, image flickering is suppressed, and eyestrain can be reduced.

Figure 13A:
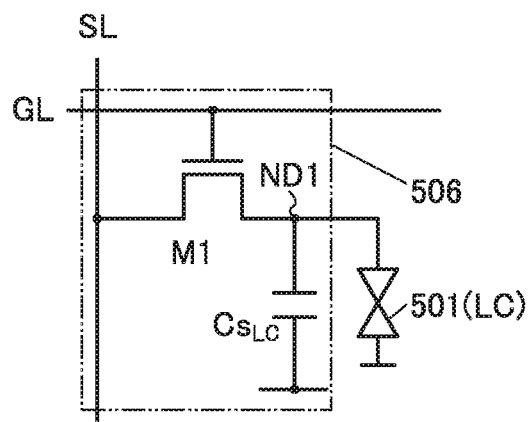
FIGS. 13A to 13C show a configuration example of a pixel and an example of a driving mode.
Figure 13B:
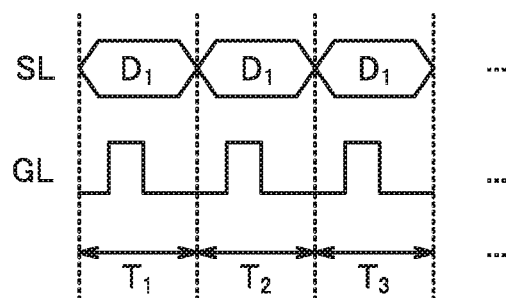
Figure 13C:
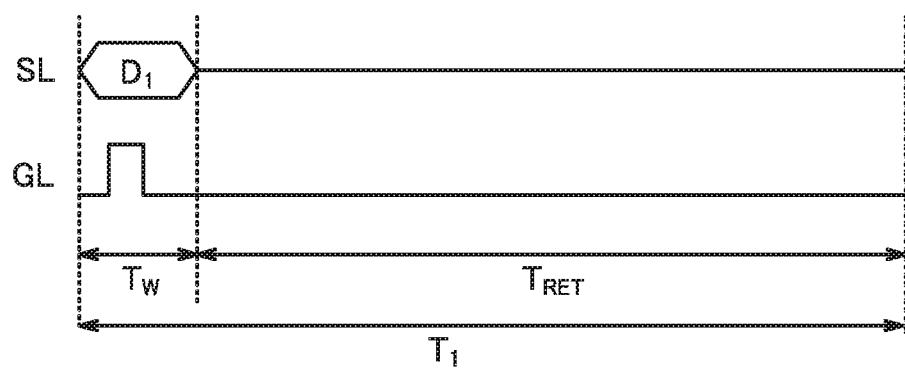

FIG. 13A shows a pixel circuit and FIGS. 13B and 13C are timing charts showing the normal driving method and the IDS driving mode. Note that in FIG. 13A, a first display element 501 (here, a reflective liquid crystal element) and a pixel circuit 506 electrically connected to the first display element 501 are illustrated. In the pixel circuit 506 illustrated in FIG. 13A, a signal line SL, a gate line GL, a transistor M1 connected to the signal line SL and the gate line GL, and a capacitor $C_{SLC}$ connected to the transistor M1 are illustrated. Note that a node to which one of electrodes of the first display element 501, one of a source and a drain of the transistor M1, and the capacitor $C_{SLC}$ are connected is referred to as a node ND1.

The transistor M1 can serve as a leakage path of data Di retained in the capacitor $C_{SLC}$. The off-state current of the transistor M1 is preferably as low as possible. A transistor including a metal oxide in a semiconductor layer in which a channel is formed is preferably used as the transistor M1. A metal oxide having at least one of an amplification function, a rectification function, and a switching function can be referred to as a metal oxide semiconductor or an oxide semiconductor (abbreviated to an OS). As a typical example of a transistor, a transistor including an oxide semiconductor in a semiconductor layer in which a channel is formed (OS transistor) is described. The OS transistor has a feature of extremely low leakage current in a non-conduction state (extremely low off-state current) as compared to a transistor containing silicon in its semiconductor layer (Si transistor). The use of an OS transistor as the transistor M1 makes it possible to retain charge supplied to the node ND1 for a long time.

Note that in the circuit diagram illustrated in FIG. 13A, the liquid crystal element LC becomes a leakage path of the data Di. Therefore, to perform IDS driving appropriately, the resistivity of the liquid crystal element LC is preferably higher than or equal to $1.0 \times 10^{14}$ Ω·cm.

Note that for example, an In—Ga—Zn oxide or an In—Zn oxide is preferably used for a channel region of the above OS transistor. The In—Ga—Zn oxide can typically have an atomic ratio of In:Ga:Zn=4:2:4.1 or a neighborhood thereof.

FIG. 13B is a timing chart showing waveforms of signals supplied to the signal line SL and the gate line GL in the normal driving mode. In the normal driving mode, a normal frame frequency (e.g., 60 Hz) is used for operation. Here, periods T1 to T3 each denote one frame period; in each frame period, a scanning signal is supplied to the gate line GL, and data Di is written from the signal line SL to the node ND1. This operation is also performed to write the same data Di in the periods T1 to T3 and to write different data in the periods T1 to T3.

FIG. 13C is a timing chart showing waveforms of signals supplied to the signal line SL and the gate line GL in the IDS driving mode. In the IDS driving, a low frame frequency (e.g., 1 Hz) is used for operation. One frame period is denoted by a period T1 and includes a data writing period $T_W$ and a data retention period $T_{RET}$. In the IDS driving mode, a scanning signal is supplied to the gate line GL and the data Di of the signal line SL is written to the capacitor $C_{SLC}$ in the period $T_W$, the gate line GL is fixed to a low-level voltage in the period $T_{RET}$, and the transistor M1 is turned off so that the written data Di is retained in the capacitor $C_{SLC}$. Note that the low frame frequency may be higher than or equal to 0.1 Hz and lower than 60 Hz, for example. For example, the low frame frequency may be higher than or equal to 0.1 Hz and lower than 20 Hz.

This embodiment can be combined with any of other embodiments as appropriate.

Embodiment 3

In this embodiment, an example of a method for driving a touch sensor is described with reference to drawings.

<Example of Sensing Method of Sensor>

Figure 14A:
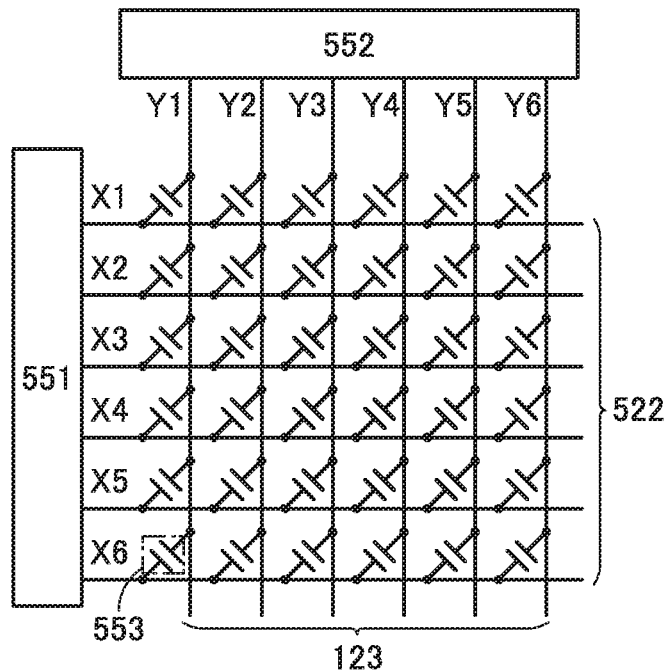
FIGS. 14A and 14B are a block diagram and a timing chart of a touch sensor.

FIG. 14A is a block diagram illustrating the structure of a mutual capacitive touch sensor. FIG. 14A illustrates a pulse voltage output circuit 551 and a current sensing circuit 552. In FIG. 14A, as an example, six wirings X1 to X6 represent electrodes 521 to which a pulse voltage is applied, and six wirings Y1 to Y6 represent electrodes 522 that sense changes in current. FIG. 14A also illustrates a capacitor 553 that is formed where the electrodes 521 and 522 overlap with each other. Note that functional replacement between the electrodes 521 and 522 is possible.

The pulse voltage output circuit 551 is a circuit for sequentially applying pulse voltage to the wirings X1 to X6. By application of a pulse voltage to the wirings X1 to X6, an electric field is generated between the electrodes 521 and 522 of the capacitor 553. When the electric field between the wirings is shielded, for example, a change occurs in the capacitor 553 (mutual capacitance). Proximity or a touch of an object can be sensed by utilizing this change.

The current sensing circuit 552 is a circuit for detecting changes in current flowing through the wirings Y1 to Y6 that are caused by changes in mutual capacitance of the capacitors 553. No change in current value is detected in the wirings Y1 to Y6 when there is no approach or contact of an object, whereas a decrease in current value is detected when mutual capacitance is decreased owing to the approach or contact of an object. Note that an integrator circuit or the like is used for sensing of current.

Note that one or both of the pulse voltage output circuit 551 and the current sensing circuit 552 may be provided over the substrate 51 or the substrate 61 illustrated in FIG.

5 or the like. For example, it is preferable that one or both of the pulse voltage output circuit 551 and the current sensing circuit 552 be formed in the same process as that of the display portion 62, the driver circuit portion 64, or the like because the process can be simplified and the number of components used for driving the touch sensor can be reduced. Alternatively, one or both of the pulse voltage output circuit 551 and the current sensing circuit 552 may be mounted on the IC 73.

In particular, when the semiconductor layers where channels of the transistors over the substrate 51 are formed using crystalline silicon such as polycrystalline silicon or single crystal silicon, driving characteristics of the pulse voltage output circuit 551, the current sensing circuit 552, and the like are increased and sensitivity of the touch sensor can be thus increased.

Figure 14B:
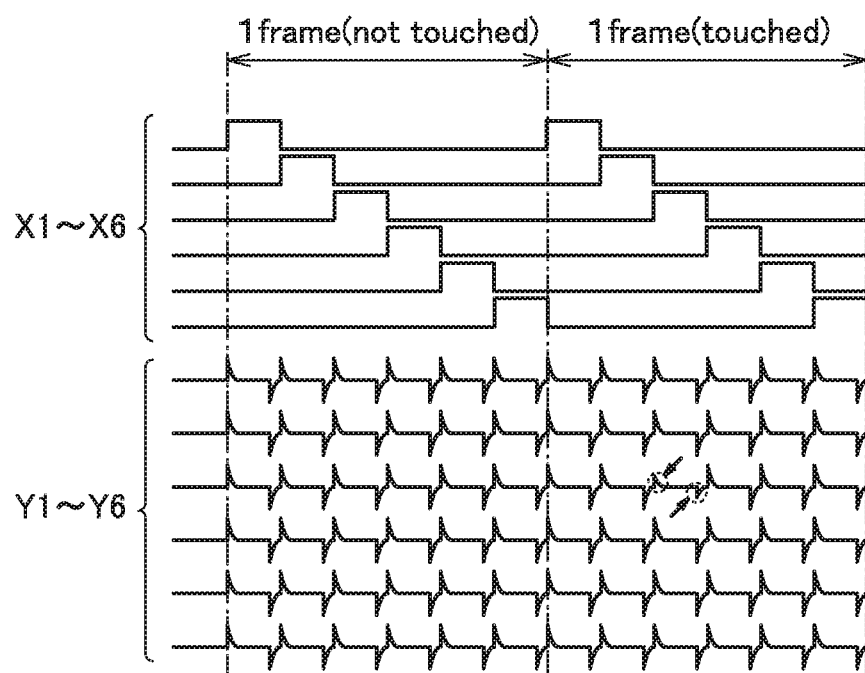

FIG. 14B is a timing chart showing input and output waveforms in the mutual capacitive touch sensor illustrated in FIG. 14A. In FIG. 14B, sensing of a sensing target is performed in all the rows and columns in one frame period. FIG. 14B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change uniformly in accordance with changes in the voltages of the wirings X1 to X6. The current value is decreased at the point of approach or contact of a sensing target and accordingly the waveform of the voltage value changes.

By sensing a change in mutual capacitance in this manner, the approach or contact of a sensing target can be sensed.

<Example of Driving Method of Display Device>

Figure 15A:
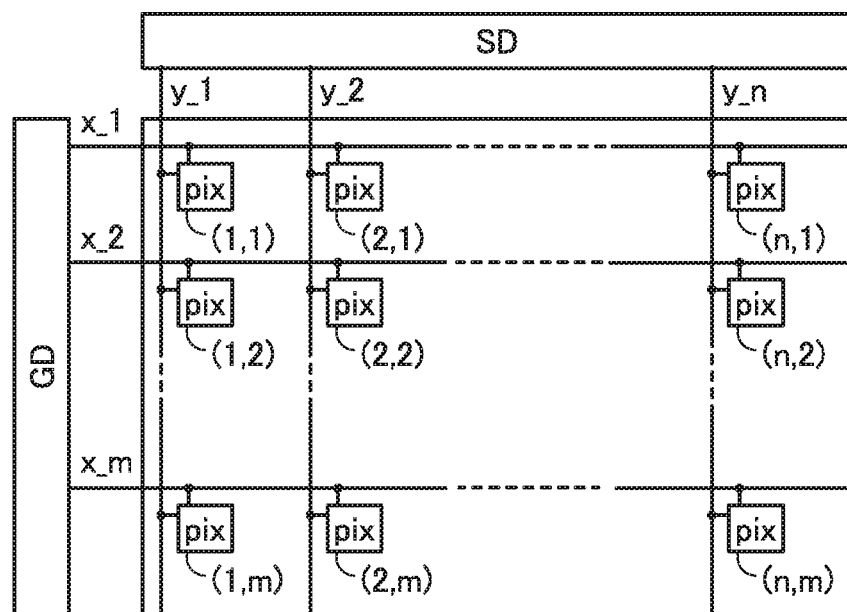
FIGS. 15A and 15B are a block diagram and a timing chart of a display device.

FIG. 15A is a block diagram illustrating a configuration example of a display device. FIG. 15A illustrates a gate driver circuit GD (a scan line driver circuit), a source driver circuit SD (a signal line driver circuit), and a display portion including a plurality of pixels pix. In FIG. 15A, gate lines x_1 to x_m (m is a natural number) electrically connected to the gate driver circuit GD and source lines y_1 to y_n (n is a natural number) electrically connected to the source driver circuit SD are shown. Corresponding to these lines, the pixels pix are denoted by (1, 1) to (n, m).

Figure 15B:
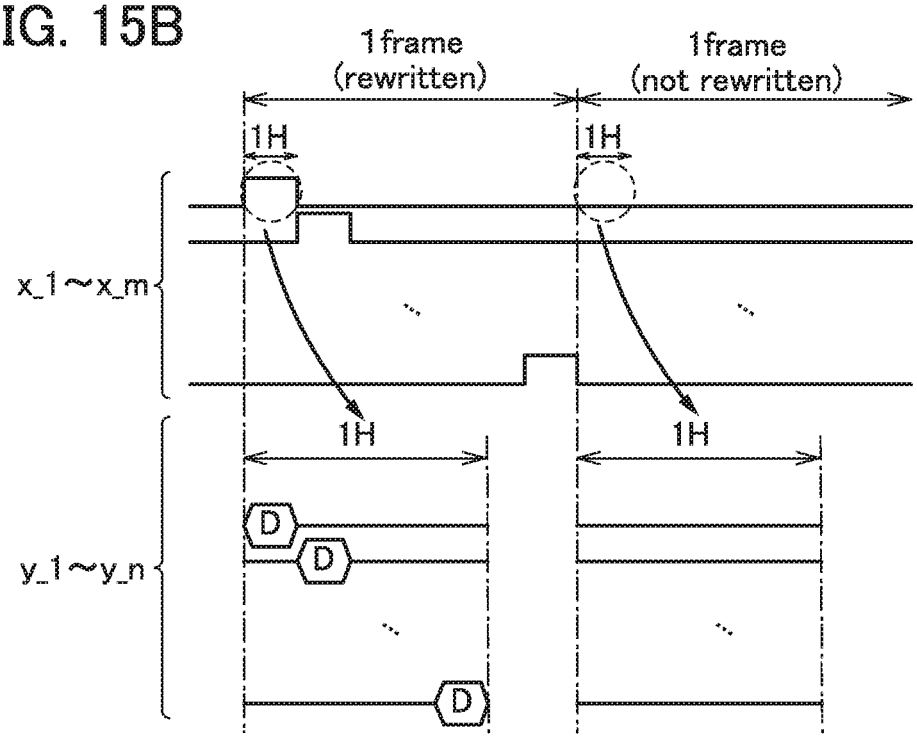

FIG. 15B is a timing chart of signals supplied to the gate lines and the source lines in the display device shown in FIG. 15A. The periods in FIG. 15B show the case where data signals are rewritten every frame period and the case where data signals are not rewritten. Note that periods such as a retrace period are not taken into consideration in FIG. 15B.

In the case where data signals are rewritten every frame period, scan signals are sequentially supplied to the gate lines x_1 to x_m. In a horizontal scanning period 1H, during which the scan signal is at an H level, data signals D are supplied to the source lines y_l to y_n in the columns.

In the case where data signals are not rewritten every frame period, supply of scan signals to the gate lines x_1 to x_m is stopped. In the horizontal scanning period 1H, supply of data signals to the source lines y_l to y_n in the columns is stopped.

A driving method in which data signals are not rewritten every frame period is effective particularly when an oxide semiconductor is used for the semiconductor layer where a channel is formed in the transistor included in the pixel pix. A transistor including an oxide semiconductor can have much lower off-state current than a transistor including a semiconductor such as silicon. Thus, a data signal written in the previous period can be held without rewriting data signals every frame period, and grayscale of pixels can be held for 1 second or longer, preferably 5 seconds or longer, for example.

In the case where polycrystalline silicon or the like is used for a semiconductor layer where a channel of a transistor included in the pixel pix is formed, the storage capacitance of the pixel is preferably increased in advance. The larger the storage capacitance is, the longer the grayscale of the pixel can be held. The storage capacitance may be determined depending on leakage current of a transistor or a display element which is electrically connected to the storage capacitor. For example, the storage capacitance per pixel is set to 5 fF to 5 pF inclusive, preferably 10 fF to 5 pF inclusive, further preferably 20 fF to 1 pF inclusive, so that a data signal written in the previous period can be held without rewriting data signals every frame period. For example, grayscale of a pixel can be held for several frame periods or several tens of frame periods.

<Example of Driving Method of Display Portion and Touch Sensor>

FIGS. 16A to 16D show examples of the operations in successive frame periods of the touch sensor described with reference to FIGS. 14A and 14B and the display portion described with reference to FIGS. 15A and 15B that are driven for 1 sec (one second). In FIG. 16A, one frame period for the display portion is 16.7 ms (frame frequency: 60 Hz), and one frame period for the touch sensor is 16.7 ms (frame frequency: 60 Hz).

In the display device of one embodiment of the present invention, the display portion and the touch sensor operate independently of each other, and the display device can have a touch sensing period concurrent with a display period. That is why one frame period for the display portion and one frame period for the touch sensor can both be 16.7 ms (frame frequency: 60 Hz) as shown in FIG. 16A. The frame frequency for the touch sensor may differ from that of the display portion. For example, as shown in FIG. 16B, one frame period for the display portion may be 8.3 ms (frame frequency: 120 Hz) and one frame period for the touch sensor may be 16.7 ms (frame frequency: 60 Hz). The frame frequency for the display portion may be 33.3 ms (frame frequency: 30 Hz) (not shown).

The frame frequency for the display portion may be changeable, i.e., the frame frequency in displaying moving images may be increased (e.g., 60 Hz or more, or 120 Hz or more), whereas the frame frequency in displaying still images may be decreased (e.g., 60 Hz or less, 30 Hz or less, or 1 Hz or less). With this structure, power consumption of the display device can be reduced. The frame frequency for the touch sensor may be changeable, and the frame frequency in waiting may differ from the frame frequency in sensing a touch.

Moreover, in the display device of one embodiment of the present invention, the following operation is possible: data signals are not rewritten in the display portion and a data signal written in the previous period is held. In that case, one frame period of the display portion can be longer than 16.7 ms. Thus, as shown in FIG. 16C, the operation can be switched so that one frame period for the display portion is 1 sec (frame frequency: 1 Hz) and one frame period for the touch sensor is 16.7 ms (frame frequency: 60 Hz).

Note that for the operation in which data signals are not rewritten in the display portion and a data signal written in the previous period is held, the above-described IDS driving mode can be referred to. As the IDS driving mode, a partial IDS driving mode may be employed in which data signals are rewritten only in a specific region of the display portion. The partial IDS driving mode is a mode in which data signals are rewritten only in a specific region of the display portion and a data signal written in the previous period is held in the other region.

Furthermore, by the driving method of a touch sensor that is disclosed in this embodiment, the touch sensor can be continuously driven in the case of FIG. 16C. Thus, data signals in the display portion can also be rewritten when the approach or contact of a sensing target is sensed by the touch sensor, as shown in FIG. 16D.

If rewriting of data signals in a display portion is performed during a sensing period of a touch sensor, noise caused by rewriting of the data signals travels through the touch sensor and the sensitivity of the touch sensor might decrease. For this reason, rewriting of data signals in a display portion and sensing by a touch sensor are preferably performed in different periods.

FIG. 17A shows an example in which rewriting of data signals in a display portion and sensing by a touch sensor are performed alternately. FIG. 17B shows an example in which sensing by a touch sensor is performed one time every two rewritings of data signals in a display portion. Note that sensing by a touch sensor may be performed once every three or more rewritings.

In the case where an oxide semiconductor is used in a semiconductor layer (where a channel is formed) of a transistor used in the pixel pix, the off-state current can be significantly reduced and the frequency of rewriting data signal can be sufficiently reduced. Specifically, a sufficiently long break period can be set between rewritings of data signals. The break period can be 0.5 seconds or longer, 1 second or longer, or 5 seconds or longer, for example. The upper limit of the break period depends on leakage current of a capacitor or a display element connected to a transistor; for example, 1 minute or shorter, 10 minutes or shorter, 1 hour or shorter, or 1 day or shorter.

FIG. 17C shows an example in which rewriting of data signals in a display portion is performed once every 5 seconds. A break period for stopping the rewriting operation of a display portion is set in FIG. 17C between rewriting of data signals and next rewriting. In the break period, a touch sensor can be operated at a frame frequency of i Hz (i is more than or equal to the frame frequency of a display device; here, 0.2 Hz or more). Sensing by a touch sensor is performed in a break period and is not performed in a rewriting period of data signals in a display portion as shown in FIG. 17C, so that sensitivity of a touch sensor can be increased. When rewriting of data signals in a display portion and sensing by a touch sensor are performed at the same time as shown in FIG. 17D, operation signals can be simplified.

In a break period during which rewriting of data signals in a display portion is not performed, not only the supply of data signals to the display portion, but also the operation of one or both of the gate driver circuit GD and the source driver circuit SD may be stopped. The supply of power to one or both of the gate driver circuit GD and the source driver circuit SD may also be stopped. Thus, noise is further reduced, and the sensitivity of the touch sensor can be further increased. Moreover, the power consumption of the display device can be further reduced.

The display device of one embodiment of the present invention includes a display portion and a touch sensor between two substrates. With this structure, the distance between the display portion and the touch sensor can be reduced. At this time, noise is easily transmitted to the touch sensor in driving the display portion, which might reduce the sensitivity of the touch sensor. When the driving method in this embodiment is employed, a display device including a touch sensor, which has both reduced thickness and high sensitivity, can be obtained.

This embodiment can be combined with any of the other embodiments as appropriate.

Embodiment 4

Described in this embodiment is a metal oxide that can be used in a semiconductor layer of a transistor disclosed in one embodiment of the present invention. Note that in the case where a metal oxide is used in a semiconductor layer of a transistor, the metal oxide can be rephrased as an oxide semiconductor.

An oxide semiconductor is classified into a single crystal oxide semiconductor and a non-single-crystal oxide semiconductor. Examples of the non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

For the semiconductor layer of the transistor disclosed in one embodiment of the present invention, a cloud-aligned composite oxide semiconductor (CAC-OS) may be used.

The aforementioned non-single-crystal oxide semiconductor or CAC-OS can be suitably used in a semiconductor layer of a transistor disclosed in one embodiment of the present invention. As the non-single-crystal oxide semiconductor, an nc-OS or a CAAC-OS can be suitably used.

In one embodiment of the present invention, a CAC-OS is preferably used in a semiconductor layer of a transistor. The use of the CAC-OS allows the transistor to have high electrical characteristics or high reliability.

The CAC-OS will be described in detail below.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in a channel region of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the aforementioned conducting function and the insulating regions have the aforementioned insulating function. In some cases, the conductive regions and the insulating regions in the material are separated at the nanoparticle level. In some cases, the conductive regions and the insulating regions are unevenly distributed in the material. The conductive regions are sometimes observed to be coupled in a cloud-like manner with their boundaries blurred.

In the CAC-OS or the CAC metal oxide, the conductive regions and the insulating regions each have a size greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC metal oxide is used in a channel region of a transistor, high current drive capability in the on state of the transistor, that is, high on-state current and high field-effect mobility, can be obtained.

In other words, the CAC-OS or the CAC-metal oxide can be referred to as a matrix composite or a metal matrix composite.

The CAC-OS has, for example, a composition in which elements included in a metal oxide are unevenly distributed. The unevenly distributed elements each have a size greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, one or more elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0) or gallium zinc oxide (Ga$_{X4}$Zn$_{Y4}$O$_{Z4}$, where X4, Y4, and Z4 are real numbers greater than 0), and a mosaic pattern is formed. Then, InO$_{X1}$ or In$_{X2}$Zn$_{Y2}$O$_{Z2}$ forming the mosaic pattern is evenly distributed in the film. This composition is also referred to as a cloud-like composition.

That is, the CAC-OS is a composite metal oxide with a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by InGaO$_3$(ZnO)$_{m1}$ (m1 is a natural number) and a crystalline compound represented by In$_{(1+x0)}$Ga$_{(1-x0)}$O$_3$(ZnO)$_{m0}$ ($-1 \leq x0 \leq 1$; m0 is a given number).

The above crystalline compounds have a single crystal structure, a polycrystalline structure, or a c-axis-aligned crystalline (CAAC) structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including GaO$_{X3}$ as a main component and the region including In$_{X2}$Zn$_{Y2}$O$_{Z2}$ or InO$_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current (Ion) and high field-effect mobility ($\mu$) can be achieved.

A semiconductor element including a CAC-OS has high reliability. Thus, the CAC-OS is suitably used in a variety of semiconductor devices typified by a display.

This embodiment can be combined with any of the other embodiments as appropriate.

Embodiment 5

In this embodiment, electronic devices of one embodiment of the present invention are described.

Examples of electronic devices include a television set, a desktop or notebook personal computer, a monitor of a computer or the like, a digital camera, a digital video camera, a digital photo frame, a mobile phone, a portable game machine, a portable information terminal, an audio reproducing device, and a large game machine such as a pachinko machine.

Figure 18A:
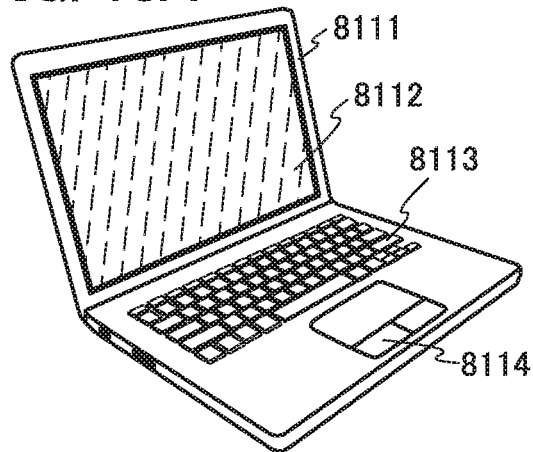
FIGS. 18A to 18E illustrates examples of electronic devices.

FIG. 18A illustrates a notebook personal computer which includes a housing 8111, a display portion 8112, a keyboard 8113, a pointing device 8114, and the like.

The display device of one embodiment of the present invention can be used in the display portion 8112. Accordingly, the notebook personal computer having the display portion with a high aperture ratio can be provided.

Figure 18B:
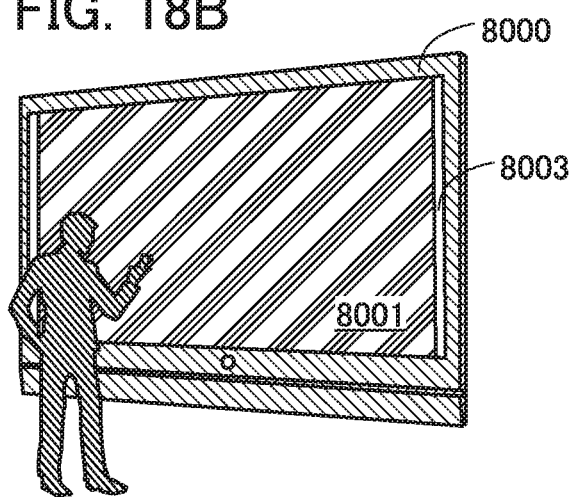
Figure 18C:
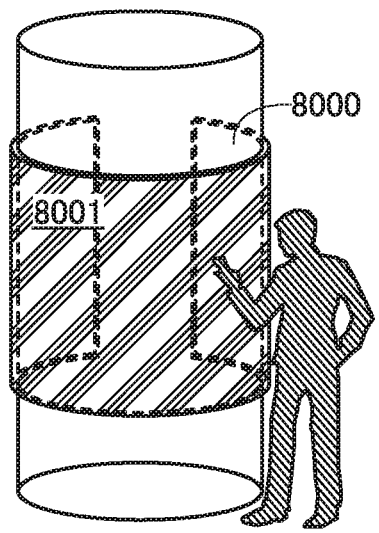

FIGS. 18B and 18C illustrate examples of digital signages. The digital signages each include a housing 8000, a display portion 8001, a speaker 8003, and the like. Also, the digital signages can each include an LED lamp, operation keys (including a power switch or an operation switch), a connection terminal, a variety of sensors, a microphone, and the like.

FIG. 18C illustrates a digital signage mounted on a cylindrical pillar.

The display device of one embodiment of the present invention can be used in the display portion 8001 illustrated in FIGS. 18B and 18C. Accordingly, the digital signage having the display portion with a high aperture ratio can be provided.

A larger display portion 8001 can provide more information at a time. In addition, a larger display portion 8001 attracts more attention, so that the effectiveness of the advertisement is expected to be increased, for example.

It is preferable to use a touch panel in the display portion 8001 because a device with such a structure does not just display a still or moving image, but can be operated by users intuitively. Alternatively, in the case where the display device of one embodiment of the present invention is used for providing information such as route information or traffic information, usability can be enhanced by intuitive operation.

Figure 18D:
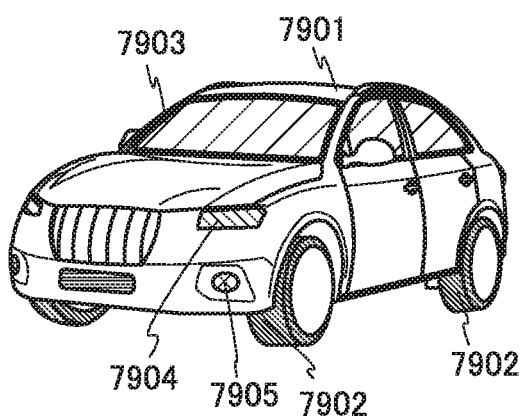
Figure 18E:
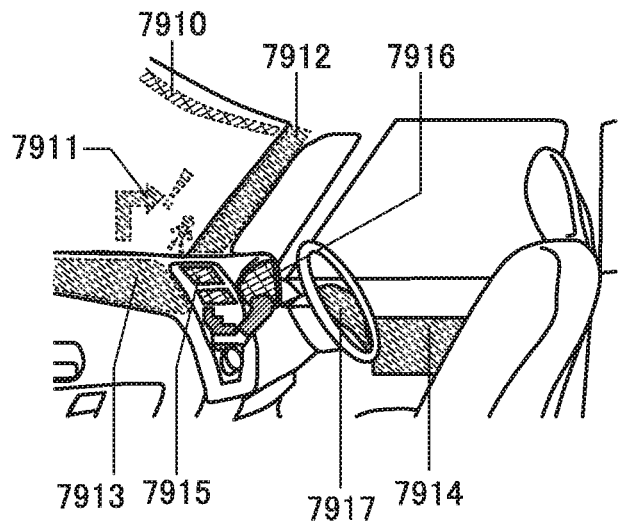

FIG. 18D is an external view of an automobile 7900. FIG. 18E illustrates a driver's seat of the automobile 7900. The automobile 7900 includes a car body 7901, wheels 7902, a windshield 7903, lights 7904, fog lamps 7905, and the like.

The display device of one embodiment of the present invention can be used in a display portion and the like of the automobile 7900. For example, the display device of one embodiment of the present invention can be used in display portions 7910 to 7917 illustrated in FIG. 18E. Accordingly, the automobile having the display portions with a high aperture ratio can be provided.

The display portion 7910 and the display portion 7911 are provided in the windshield 7903 of the automobile 7900. The display device of one embodiment of the present invention can be a see-through device, through which the opposite side can be seen, by using a light-transmitting conductive material for its electrodes. Such a see-through display device does not hinder driver's vision during the driving of the automobile 7900. Thus, the display device 10 of one embodiment of the present invention can be provided in the windshield 7903 of the automobile 7900. Note that in the case where a transistor or the like is provided in the display device, a transistor having light-transmitting properties, such as an organic transistor using an organic semiconductor material or a transistor using an oxide semiconductor, is preferably used.

A display portion 7912 is provided on a pillar portion. A display portion 7913 is provided on a dashboard. A display portion 7914 is provided in a door portion. For example, the display portion 7912 can compensate for the view hindered by the pillar portion by showing an image taken by an imaging unit provided on the car body. Similarly, the display portion 7913 can compensate for the view hindered by the dashboard and the display portion 7914 can compensate for the view hindered by the door. That is, showing an image taken by an imaging unit provided on the outside of the car body leads to elimination of blind areas and enhancement of safety. In addition, showing an image so as to compensate for the area which a driver cannot see makes it possible for the driver to confirm safety easily and comfortably.

The display portion 7917 is provided in a steering wheel. The display portion 7915, the display portion 7916, or the display portion 7917 can display a variety of information such as navigation information, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 7910 to 7914.

The display portions 7910 to 7917 can also be used as lighting devices.

This embodiment can be combined with any of other embodiments as appropriate.

This application is based on Japanese Patent Application Serial No. 2016-226897 filed with Japan Patent Office on Nov. 22, 2016, the entire contents of which are hereby incorporated by reference.

What is claimed is:

1. A display device comprising:
   a transistor comprising:
     a first insulating layer;
     a first semiconductor layer comprising a channel region over and in contact with the first insulating layer;
     a second insulating layer over the first semiconductor layer; and
     a first conductive layer directly connected to the first semiconductor layer via an opening portion in the second insulating layer; and
   a capacitor comprising:
     a second conductive layer over and in contact with the first insulating layer;
     the second insulating layer over the second conductive layer; and
     the first conductive layer over the second insulating layer,
   wherein the first conductive layer serves as one electrode of the capacitor and one of a source electrode and a drain electrode of the transistor,
   wherein the second insulating layer serves as a dielectric layer of the capacitor and a channel protective layer of the transistor, and
   wherein the first conductive layer and the second conductive layer comprise a metal oxide and have a light-transmitting property.

2. The display device according to claim 1, wherein the metal oxide comprises indium and zinc.

3. The display device according to claim 1, wherein the second insulating layer comprises silicon and nitrogen.

4. The display device according to claim 1, further comprising a third insulating layer over and in contact with the second insulating layer and the first conductive layer,
   wherein the third insulating layer comprises oxygen at a higher proportion than a stoichiometric composition.

5. The display device according to claim 1, further comprising a gate electrode of the transistor having a light-blocking property.

6. The display device according to claim 1, wherein the other of the source electrode and the drain electrode has a light-blocking property.

7. A display device comprising:
   a transistor comprising:
     a first insulating layer;
     a first semiconductor layer comprising a channel region over and in contact with the first insulating layer;
     a second insulating layer over the first semiconductor layer; and
     a first conductive layer directly connected to the first semiconductor layer via an opening portion in the second insulating layer; and
   a capacitor comprising:
     a second conductive layer over and in contact with the first insulating layer;
     the second insulating layer over the second conductive layer; and
     the first conductive layer over the second insulating layer,
   wherein the first conductive layer and the second conductive layer comprise a metal oxide and have a light-transmitting property.

8. The display device according to claim 7, wherein the metal oxide comprises indium and zinc.

9. The display device according to claim 7, wherein the second insulating layer comprises silicon and nitrogen.

10. The display device according to claim 7, further comprising a third insulating layer over and in contact with the second insulating layer and the first conductive layer,
    wherein the third insulating layer comprises oxygen at a higher proportion than a stoichiometric composition.

11. The display device according to claim 7, further comprising a gate electrode of the transistor having a light-blocking property.

12. The display device according to claim 7,
    wherein the first conductive layer serves as one of a source electrode and a drain electrode of the transistor, and
    wherein the other of the source electrode and the drain electrode has a light-blocking property.

13. A display device comprising:
    a transistor comprising:
      a first insulating layer;
      a first semiconductor layer comprising a channel region over and in contact with the first insulating layer;
      a second insulating layer over the first semiconductor layer; and
      a first conductive layer electrically connected to the first semiconductor layer via an opening portion in the second insulating layer; and
    a capacitor comprising:
      a second conductive layer over and in contact with the first insulating layer;
      the second insulating layer over the second conductive layer; and
      the first conductive layer over the second insulating layer,
    wherein the first conductive layer and the second conductive layer comprise a metal oxide and have a light-transmitting property,
    wherein the first conductive layer serves as one of a source electrode and a drain electrode of the transistor, and
    wherein the other of the source electrode and the drain electrode has a light-blocking property.

14. The display device according to claim 13, wherein the metal oxide comprises indium and zinc.

15. The display device according to claim 13, wherein the second insulating layer comprises silicon and nitrogen.

16. The display device according to claim 13, further comprising a third insulating layer over and in contact with the second insulating layer and the first conductive layer,
    wherein the third insulating layer comprises oxygen at a higher proportion than a stoichiometric composition.

17. The display device according to claim 13, further comprising a gate electrode of the transistor having a light-blocking property.

* * * * *